US010923516B2

(12) United States Patent
Terauchi et al.

(10) Patent No.: US 10,923,516 B2
(45) Date of Patent: Feb. 16, 2021

(54) IMAGE CAPTURING DEVICE, IMAGE CAPTURING METHOD, IMAGE PROCESSING DEVICE, IMAGE PROCESSING METHOD, AND STORAGE MEDIUM

(71) Applicants: Masakazu Terauchi, Tokyo (JP); Hiroyasu Uehara, Tokyo (JP)

(72) Inventors: Masakazu Terauchi, Tokyo (JP); Hiroyasu Uehara, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 28 days.

(21) Appl. No.: 16/356,222

(22) Filed: Mar. 18, 2019

(65) Prior Publication Data
US 2019/0296062 A1 Sep. 26, 2019

(30) Foreign Application Priority Data

Mar. 22, 2018 (JP) .................. 2018-054059
Feb. 8, 2019 (JP) .................. 2019-021124

(51) Int. Cl.
H01L 27/146 (2006.01)
H04N 5/232 (2006.01)
G06F 9/30 (2018.01)
H04N 5/341 (2011.01)

(52) U.S. Cl.
CPC .... H01L 27/14605 (2013.01); G06F 9/30003 (2013.01); H04N 5/23229 (2013.01); H04N 5/341 (2013.01)

(58) Field of Classification Search
CPC ............... G06F 9/30003; G06T 3/4015; H01L 27/14605; H04N 5/23229; H04N 5/341; H04N 5/349; H04N 5/367; H04N 9/04515
See application file for complete search history.

(56) References Cited

U.S. PATENT DOCUMENTS

| 5,671,013 | A | * | 9/1997 | Nakao | ..................... H04N 5/235 348/234 |
| 6,532,264 | B1 | * | 3/2003 | Kahn | ...................... H04N 5/144 348/E5.065 |
| 8,593,547 | B2 | * | 11/2013 | Ueda | ................. H04N 5/232122 348/246 |
| 2003/0063203 | A1 | * | 4/2003 | Ohno | ..................... H04N 5/367 348/247 |
| 2007/0230779 | A1 | * | 10/2007 | Sato | ........................ H04N 5/367 382/167 |
| 2013/0002910 | A1 | * | 1/2013 | Sambonsugi | .......... H04N 5/367 348/246 |

(Continued)

FOREIGN PATENT DOCUMENTS

| JP | 1-147973 | 6/1989 |
| JP | 2015-226135 | 12/2015 |

(Continued)

Primary Examiner — Amy R Hsu
(74) Attorney, Agent, or Firm — Oblon, McClelland, Maier & Neustadt, L.L.P.

(57) ABSTRACT

There is provided an image capturing device including: an inputter configured to receive first image data and second image data; a pixel determiner configured to determine a second pixel included in the second image data and corresponding to a first pixel included in the first image data; and a corrector configured to correct a value of the first pixel with a value of the second pixel.

19 Claims, 21 Drawing Sheets

(56) References Cited

U.S. PATENT DOCUMENTS

| | | | |
|---|---|---|---|
| 2015/0116538 A1 | 4/2015 | Terauchi et al. | |
| 2015/0244956 A1* | 8/2015 | Furuya ................ | H04N 5/3675 348/246 |
| 2018/0263587 A1* | 9/2018 | Takahashi ............ | H04N 5/3205 |

FOREIGN PATENT DOCUMENTS

| | | |
|---|---|---|
| JP | 2016-010008 | 1/2016 |
| JP | 2016-058771 | 4/2016 |
| JP | 2018-007083 | 1/2018 |

* cited by examiner

FIG. 5

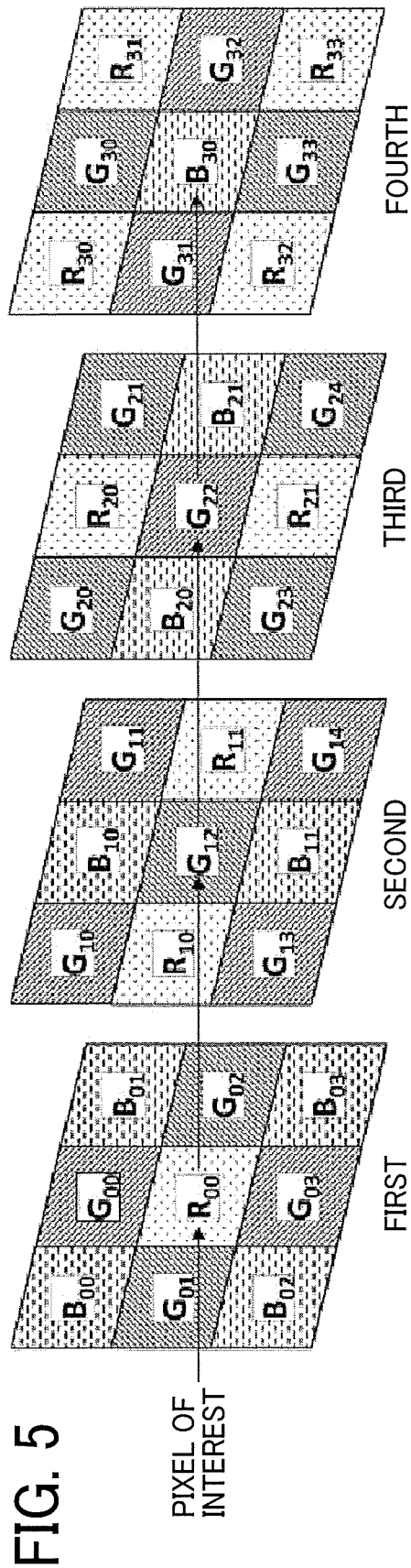

PIXEL OF INTEREST

FIRST  SECOND  THIRD  FOURTH $R = R_{00}$
$G = \dfrac{G_{12} + G_{22}}{2}$
$B = B_{30}$

COMBINATION FOR INCREASING RESOLUTION

IN CASE WHERE $R_{00}$ IS DEFECTIVE PIXEL, R IS AS FOLLOWS.
$$R = \frac{2R_{10} + 2R_{11} + 2R_{20} + 2R_{21} + R_{30} + R_{31} + R_{32} + R_{33}}{12}$$

IN CASE WHERE $G_{12}$ IS DEFECTIVE PIXEL, G IS AS FOLLOWS.
$$G = G_{22}$$

IN CASE WHERE $G_{22}$ IS DEFECTIVE PIXEL, G IS AS FOLLOWS.
$$G = G_{12}$$

IN CASE WHERE $B_{30}$ IS DEFECTIVE PIXEL, B IS AS FOLLOWS.
$$B = \frac{B_{00} + B_{01} + B_{02} + B_{03} + 2B_{10} + 2B_{11} + 2B_{20} + 2B_{21}}{12}$$

$$X = \frac{R_0 + 2R_1 + R_2 + 2R_3 + 2R_5 + R_6 + 2R_7 + R_8}{12}$$

$$X = \frac{2R_{10} + 2R_{11} + 2R_{20} + 2R_{21} + R_{30} + R_{31} + R_{32} + R_{33}}{12}$$

FIG. 8

FIG. 15A
FIRST IMAGE

| 1-1 | 1-2 | ... | ... |
| --- | --- | --- | --- |
| ... | ... | ... | ... |
| ... | ... | ... | ... |
| ... | ... | ... | 1-N |

FIG. 15B
SECOND IMAGE

| 2-1 | 2-2 | ... | ... |
| --- | --- | --- | --- |
| ... | ... | ... | ... |
| ... | ... | ... | ... |
| ... | ... | ... | 2-N |

FIG. 15C
THIRD IMAGE

| 3-1 | 3-2 | ... | ... |
| --- | --- | --- | --- |
| ... | ... | ... | ... |
| ... | ... | ... | ... |
| ... | ... | ... | 3-N |

FIG. 15D
FOURTH IMAGE

| 4-1 | 4-2 | ... | ... |
| --- | --- | --- | --- |
| ... | ... | ... | ... |
| ... | ... | ... | ... |
| ... | ... | ... | 4-N |

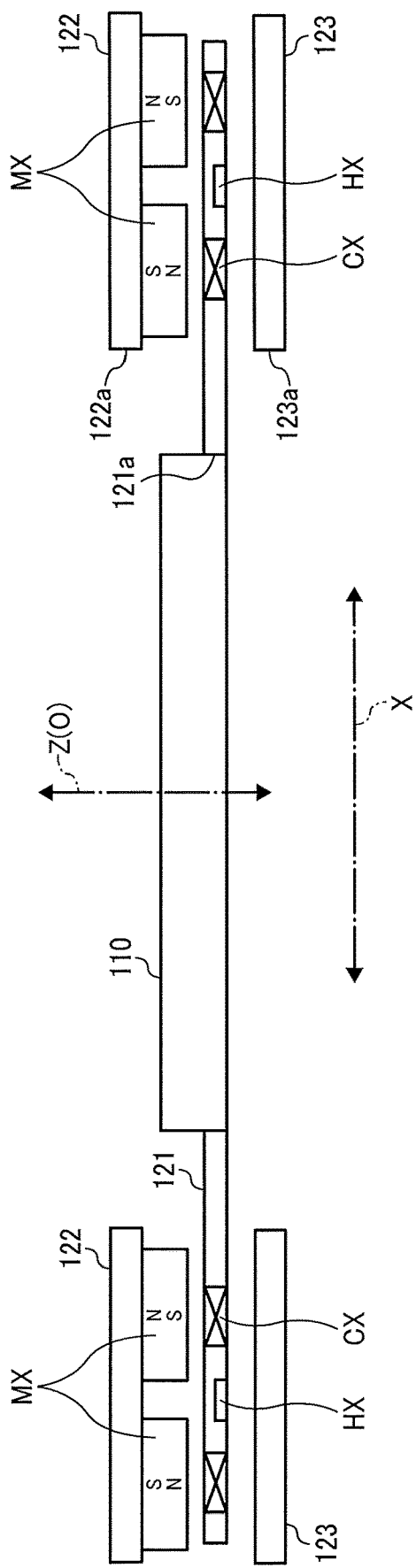

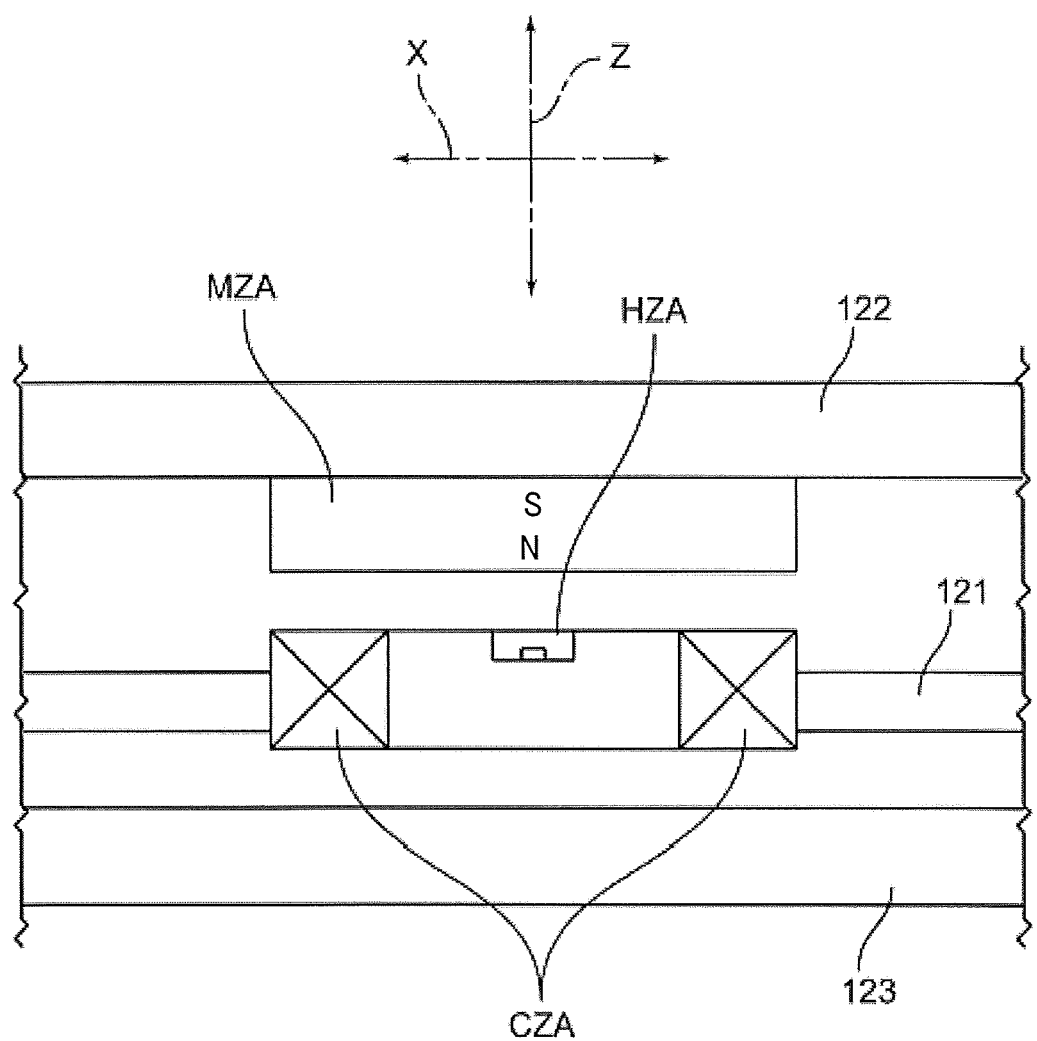

US 10,923,516 B2

IMAGE CAPTURING DEVICE, IMAGE CAPTURING METHOD, IMAGE PROCESSING DEVICE, IMAGE PROCESSING METHOD, AND STORAGE MEDIUM

CROSS-REFERENCE TO RELATED APPLICATIONS

This patent application is based on and claims priority pursuant to 35 U.S.C. § 119(a) to Japanese Patent Application No. 2018-054059, filed on Mar. 22, 2018 and Japanese Patent Application No. 2019-021124, filed on Feb. 8, 2019, in the Japan Patent Office, the entire disclosure of which is hereby incorporated by reference herein.

BACKGROUND

Technical Field

The embodiments of the present disclosure relate to an image capturing device, an image capturing method, an image processing device, an image processing method, and a non-transitory recording medium storing program code for causing the image processing device to perform the image processing method.

Description of the Related Art

An image sensor includes hundreds of thousands to tens of millions of pixels that are arranged therein; however, some of the pixels fail to generate a signal to be output therefrom due to a crystal defect in a material that forms the image sensor, dust, or other affecting factors. For example, in a case where a pixel in an image sensor has a defect, among the pixels of an image output from the image sensor, the pixel value for the pixel having a defect is different from a correct value, and the image may become unnatural.

In order to avoid a situation where an unnatural image is obtained in a camera due to a defect of a pixel, a defective pixel having a defect is detected and restored so as to become close to the original state.

SUMMARY

An image capturing device according to an embodiment of the present disclosure includes image capturing device comprising circuitry configured to receive first image data and second image data; determine a second pixel included in the second image data and corresponding to a first pixel included in the first image data; and correct a value of the first pixel with a value of the second pixel.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein:

FIG. 5 is a schematic diagram illustrating obtaining of a replacement pixel and/or a correction value by the pixel determiner;

FIG. 8 is a schematic diagram illustrating pixel replacement by a replacer;

FIGS. 15A to 15D are diagrams illustrating an example case where a plurality of images is each divided into image regions so that the image regions of each of the images correspond to the image regions of the other images;

FIGS. 17A and 17B illustrate an example configuration of an anti-shake unit where FIG. 17A is a rear view of the anti-shake unit and FIG. 17B is a cross-sectional view thereof;

FIG. 20 is a cross-sectional view of a Z driving unit including a Z-direction magnet, a Z-driving coil, and a Z-direction Hall element in an enlarged manner;

Figure 1:
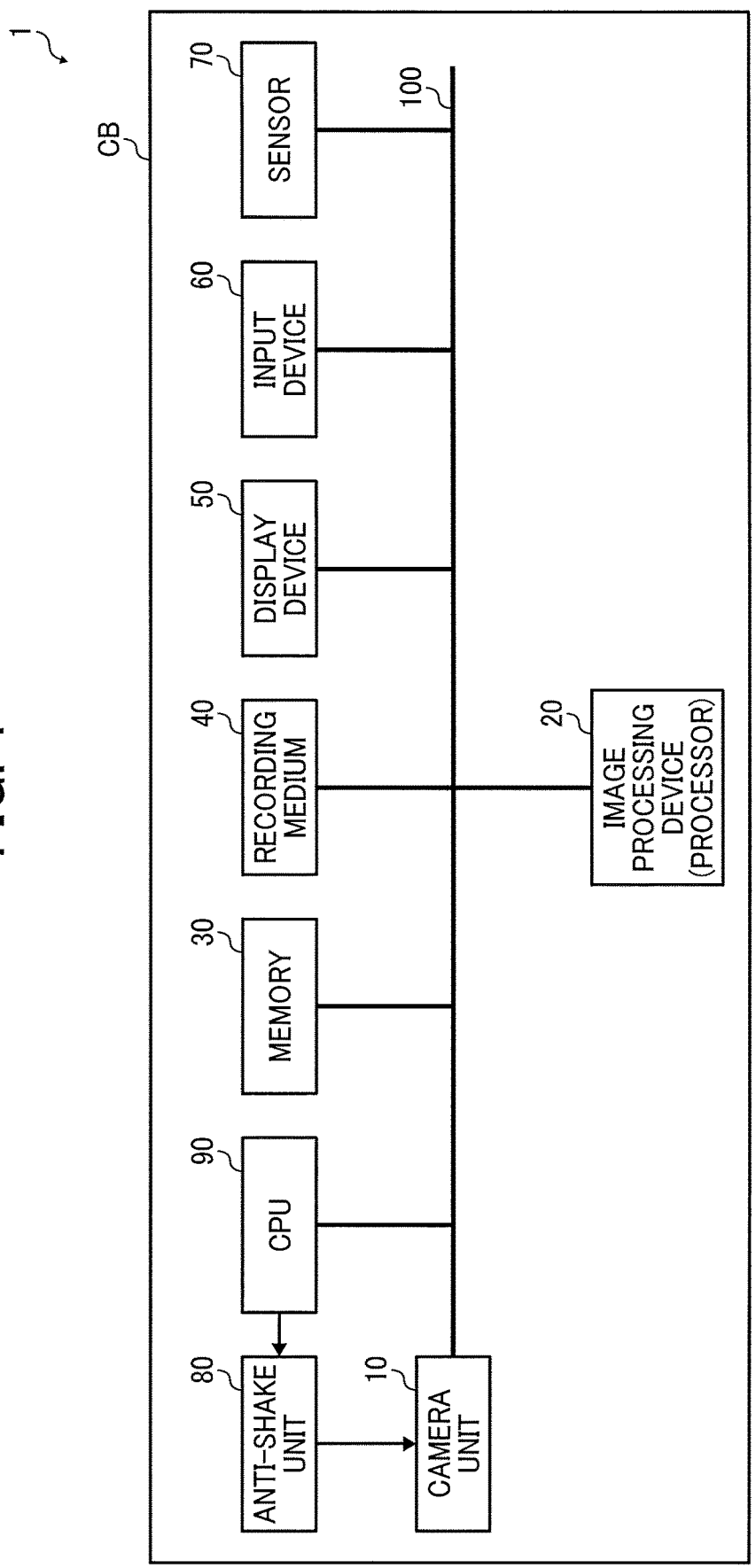
FIG. 1 is a block diagram schematically illustrating a configuration of an electronic apparatus that is equipped with a camera unit and in which an image capturing device, an image capturing method, an image capturing program, an image processing device, an image processing method, and an image processing program according to a first embodiment are installed.
Figure 2A:
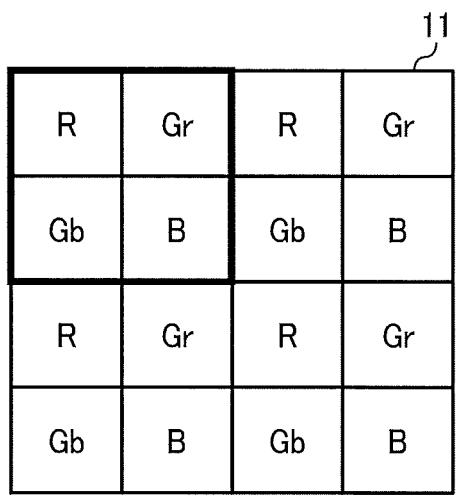
FIGS. 2A to 2D are schematic diagrams illustrating an example of a multi-shot combination mode.
Figure 2B:
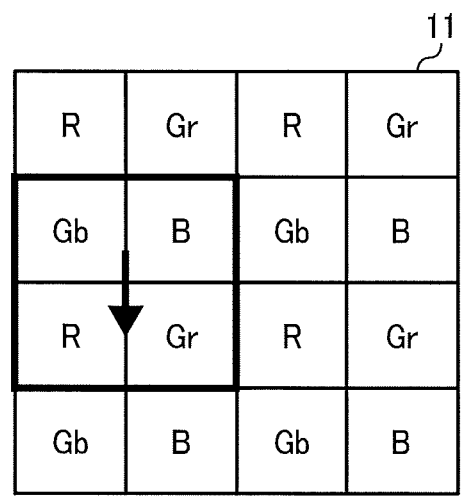
Figure 2C:
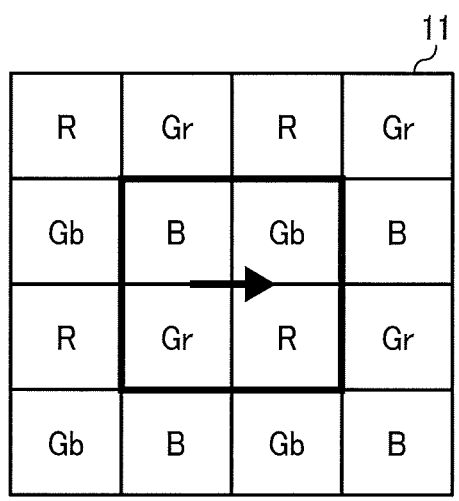
Figure 2D:
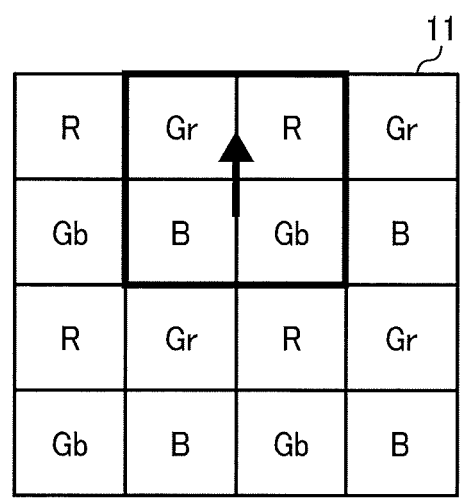

The accompanying drawings are intended to depict embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Hereinafter, as an example of a method and device for correcting a defective pixel according to one embodiment of the present technique, a method and device for correcting a defective pixel used in an image capturing device are illustrated and described. Note that a detailed expression more than necessary may be omitted in some cases. For example, a detailed description of a well-known matter or a duplicated description of substantially the same configuration may be omitted. This is to avoid the following description becoming needlessly redundant and to facilitate understanding by a person skilled in the art.

The attached drawings and the following description are provided by the present inventors for a person skilled in the art to fully understand the present technique, and are not intended to limit the subjects described in the claims.

In the present embodiments, a defect may be produced in a "pixel of an image sensor" and, when a defect is produced in a pixel of an image sensor, the pixel value of a "pixel of an image" output from the image sensor, the pixel of the image being corresponding to the pixel of the image sensor having a defect, becomes different from a correct value. For convenience of description, a pixel in which a defect is produced may be herein expressed as a "defective pixel", and a "pixel of an image sensor" having a defect may be herein expressed as a "pixel of an image" having a defect. Calculating a post-correction pixel value (hereinafter expressed as a correction value) for such a defective pixel and replacing the pixel value (in data) are expressed as correcting (restoring) pixel information.

Image data for which a defective pixel is to be corrected may be expressed as correction target image data. Image data that is referenced to calculate a correction value for correction target image data may be expressed as correction image data. The number of pieces of correction target image data and the number of pieces of correction image data can be flexibly set, need to be at least one each, and may be set to any numbers.

The correction target image data and the correction image data are data sets in which the position relationship between an object and a defective pixel differs. For example, in a case where the first piece of image data among the four pieces of image data obtained by serial image capturing in a multi-shot is assumed to be the correction target image data (first image data described below), it is desirable to assume the three pieces of image data other than the first piece of image data to be the correction image data (second image data described below).

In the correction target image data and the correction image data, the position relationship between an object and a defective pixel differs. Therefore, even if the pixel value of a pixel that is defective is not correctly output from the correction target image data, the pixel value is highly likely to be correctly output from the correction image data. Accordingly, on the basis of position information about the defective pixel in the correction target image data and information about the amount of displacement of the position between the correction target image data and the correction image data (the amount of pixel displacement or the amount of position displacement), pixel information at a position, in the correction image data, corresponding to the defective pixel can be referenced. The method for calculating the amount of pixel displacement and the method for calculating a correction value will be described in detail below. Position information about a pixel is information about the coordinates of the pixel in the image data.

There may be a case where the correction target image data functions as the correction image data for certain image data, which will be described below. The terms "image data" and "image" are assumed to be equivalent to each other and used.

First Embodiment

FIG. 1 is a block diagram schematically illustrating a configuration of an electronic apparatus 1 that is equipped with a camera unit and in which an image capturing device, an image capturing method, an image capturing program, an image processing device, an image processing method, and an image processing program according to a first embodiment are installed. The image capturing method, the image capturing program, the image processing method, and the image processing program according to the first embodiment are implemented by causing a computer built in the electronic apparatus 1 to perform predetermined processing steps.

As the electronic apparatus 1, for example, various apparatuses, such as a digital camera, a mobile phone, and a game apparatus, having an image capturing function can be used. In the first embodiment, an example case where the electronic apparatus 1 is a digital camera is illustrated and described. Alternatively, the electronic apparatus 1 need not have an image capturing function, and various apparatuses, such as a personal computer (PC), receiving an input image and performing image processing for the image can be used as the electronic apparatus 1.

The digital camera 1 has a camera body CB in which a camera unit (obtainer) 10, an image processing device (processor) 20, a memory (for example, a random access memory (RAM)) 30, a recording medium (for example, a Universal Serial Bus (USB) memory) 40, a display device (for example, a liquid crystal display (LCD)) 50, an input device 60, a sensor 70, an anti-shake unit 80, a central processing unit (CPU) (controller) 90, and a bus 100 that directly or indirectly connects these constituent elements with each other are included. The image processing device (processor) 20 and the CPU 90 may be formed as the same hardware unit or different hardware units.

The camera unit 10 includes an image capturing optical system (not illustrated) and an image sensor (image sensor element) 11 (FIGS. 2A to 2D). The image capturing optical system is used to capture an object image, which is formed on the photosensitive surface of the image sensor 11, converted to electric signals by a plurality of pixels that are arranged in a matrix and detect different colors, and output to the image processing device 20 as an image. The image processing device 20 performs predetermined image processing for the image obtained by the camera unit 10. The image subjected to image processing by the image processing device 20 is temporarily recorded to the memory 30. The image recorded to the memory 30 is saved in the recording medium 40 and displayed on the display device 50 in accordance with selection and decision by the user.

The input device 60 is constituted by, for example, a power switch, a release switch, a dial switch for selecting and setting various functions, a four-direction switch, and a touch panel. The sensor 70 is constituted by, for example, an acceleration sensor, an angular speed sensor, and an angular acceleration sensor that respectively detect an acceleration, an angular speed, and an angular acceleration experienced by the body of the digital camera 1. The sensor 70 outputs shake detection signals that indicate shakes of the body of the digital camera 1, which are input to the CPU 90.

The anti-shake unit 80 drives at least one of the image capturing optical system and the image sensor 11, which is a movable member (driven member), of the camera unit 10 in a direction different from the optical axis of the image capturing optical system (for example, within a plane orthogonal to the optical axis of the image capturing optical system). The CPU 90 drives and controls the anti-shake unit 80. The CPU 90 receives shake detection signals input from the sensor 70 and indicating shakes of the body of the digital camera 1 and causes the anti-shake unit 80 to drive the movable member in a direction different from the optical axis of the image capturing optical system. Accordingly, the position of an object image formed on the image sensor 11 is displaced, so that an image blur caused by camera shake can be corrected. The configuration of the anti-shake unit 80 will be described in detail below.

The digital camera 1 has an image capture mode (multi-shot combination mode or multi-shot high-resolution image capture mode) in which the digital camera 1 performs image capturing a plurality of times on a time-series basis while causing the anti-shake unit 80 to slightly move the image sensor 11 of the camera unit 10 in a direction different from the optical axis of the image capturing optical system (for example, within a plane orthogonal to the optical axis of the image capturing optical system) and combines the images into one image (combines the images not by simply adding up the images but by performing a special operation including image processing on the data) to thereby generate an ultrahigh-resolution (high quality and high resolution) image. In the "multi-shot combination mode", unlike the existing Bayer scheme in which only information about one color is obtained per pixel, information about colors of red (R), green (G), and blue (B) is obtained per pixel, so that a very high-resolution image that presents fine details and is excellent in terms of color reproduction can be generated. Further, a moire pattern or a false color is not produced, which results in an effect in which highly sensitive noise can be reduced.

FIGS. 2A to 2D are schematic diagrams illustrating an example of the multi-shot combination mode in the first embodiment. In FIGS. 2A to 2D, the image sensor 11 includes a large number of pixels arranged in a matrix at a predetermined pixel pitch on the photosensitive surface. On the front surface of each pixel, one of the color filters R, G (Gr or Gb) and B in the Bayer pattern is arranged. Each pixel detects a color of light from an object passing through the color filter R, G (Gr or Gb) or B on the front surface and incident thereon, that is, performs photoelectric conversion for a color component of the light (in a specific wavelength range), to obtain output corresponding to the intensity of the light (brightness). More specifically, one image is captured when a light flux region outlined by a thick line is located at a reference position illustrated in FIG. 2A, one image is subsequently captured when the light flux region outlined by a thick line is moved downward relative to the image sensor 11 by one-pixel pitch and located at a position illustrated in FIG. 2B, one image is subsequently captured when the light flux region outlined by a thick line is moved rightward relative to the image sensor 11 by one-pixel pitch and located at a position illustrated in FIG. 2C, one image is subsequently captured when the light flux region outlined by a thick line is moved upward relative to the image sensor 11 by one-pixel pitch and located at a position illustrated in FIG. 2D, and the light flux region outlined by a thick line last returns to the reference position illustrated in FIG. 2A. Accordingly, four images captured on a time-series basis while the image sensor 11 is driven within a plane orthogonal to the optical axis so that the light flux region outlined by a thick line is moved relative to the image sensor 11 so as to draw a square measuring one-pixel pitch per side are input to the image processing device 20 as raw image data. The image processing device 20 combines the four images captured on a time-series basis using the image sensor 11 to obtain a combined image. In the example illustrated in FIGS. 2A to 2D, the light flux region (image capture region) is moved relative to the image sensor 11 by one-pixel pitch. For an image sensor in which the Bayer pattern is formed of four pixels, the light flux region needs to be relatively moved by an odd-numbered pixel pitch and need not be relatively moved by one-pixel pitch. For example, in FIG. 10 described below, the light flux region (image capture region) is moved relative to the image sensor 11 by three-pixel pitch.

The image processing device 20 has a function of, in a case where image data (first image data) includes a defective pixel (first pixel), correcting the defective pixel by using a replacement pixel and/or a correction value based on the replacement pixel (second pixel), the replacement pixel and/or correction value being based on image data (second image data) other than the image data including the defective pixel among a plurality of pieces of image data. The configuration and the operations and effects of the image processing device 20 concerning this function are described in detail below. An example case where four pieces of image data obtained for multi-shot combination are used as the plurality of pieces of image data is illustrated as appropriate and described below.

Figure 3:
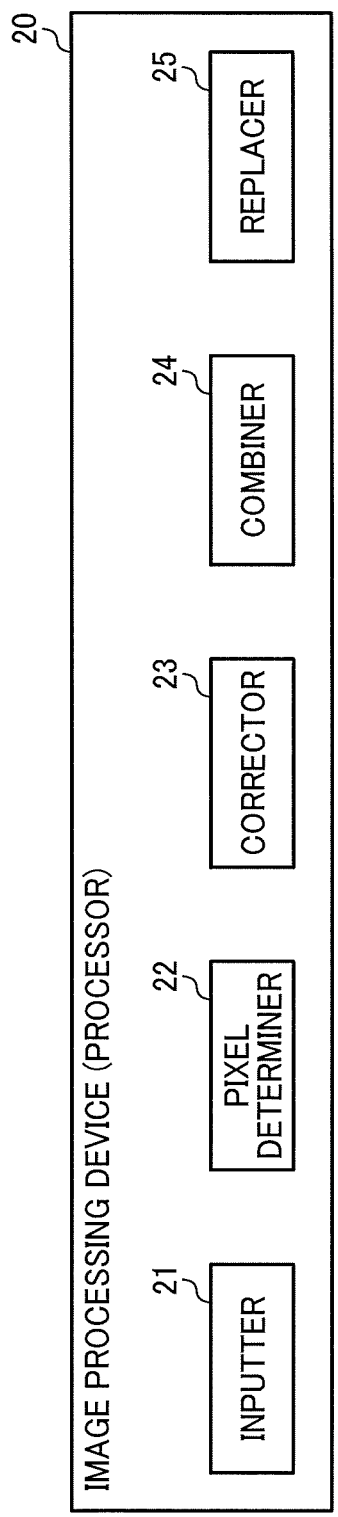
FIG. 3 is a functional block diagram illustrating an example of the internal configuration of an image processing device (processor)

FIG. 3 is a functional block diagram illustrating an example of the internal configuration of the image processing device (processor) 20. As illustrated in FIG. 3, the image processing device (processor) 20 includes an inputter (image data input unit) 21, a pixel determiner (defective pixel detecting unit, position displacement amount calculating unit, replacement pixel/correction value obtaining unit) 22, a corrector (defective pixel correcting unit) 23, a combiner (image data combining unit) 24, and a replacer (image surface phase difference correction pixel replacing unit) 25 as functional constituent elements of the CPU that constitutes the image processing device (processor) 20.

To the inputter 21, a plurality of pieces of image data (four pieces of image data obtained for multi-shot combination) are input. Any piece of image data among the plurality of pieces of image data can be assumed to be "first image data", and the other pieces of image data among the plurality of pieces of image data can be assumed to be "second image data". The first image data and the second image data can be output from the same image sensor 11. The first image data and the second image data can have different image position relationships.

The pixel determiner 22 determines the second pixel included in the second image data and corresponding to the first pixel included in the first image data, the first image data and the second image data being input to the inputter 21.

The pixel determiner 22 detects a defective pixel (first pixel) included in any piece of image data (first image data) among the plurality of pieces of image data and obtains position information about the defective pixel. The method for the pixel determiner 22 to detect a defective pixel (first pixel) and obtain position information about the defective pixel can be flexibly designed, and various design changes can be made to the method. For example, the pixel determiner 22 can compare the pixel value of each pixel of an image (which may be hereinafter referred to as a captured image as appropriate) captured by the image sensor 11 with a predetermined threshold to thereby determine whether the pixel is a defective pixel. In addition to this, a method in which output information from the image sensor 11 at the time of image capturing is used to determine whether a defective pixel is present at the time of image capturing or a method in which, in a manufacturing process of the image capturing device or the image sensor element, the address of a defective pixel is recorded on the basis of a captured image and saved in a memory of the image capturing device can be used. As described above, although any method may be used, position information about a defective pixel in image data needs to be obtained. A defective pixel is not limited to a pixel that becomes defective due to the characteristics of the sensor or a problem concerning manufacturing and may be a functional pixel, such as a phase difference detection pixel (image surface phase difference pixel).

The pixel determiner 22 calculates the amount of pixel displacement (amount of position displacement) between the plurality of pieces of image data, namely, for example, the amount of pixel displacement (amount of position displacement) between the first image data and the second image data. The pixel determiner 22 can use a known technique, such as a block matching, disclosed by, for example, Japanese Patent No. 4760923 to accurately detect the amount of pixel displacement between the plurality of pieces of image data (for example, the first image data and the second image data) with certainty. The pixel determiner 22 can detect the amount of pixel displacement between the plurality of pieces of image data on the basis of output from at least one of the acceleration sensor, the angular speed sensor, and the angular acceleration sensor that constitute the sensor 70. Further, the pixel determiner 22 can detect the amount of pixel displacement between the plurality of pieces of image data by using a method, such as block matching, for calculating the amount of pixel displacement between the plurality of pieces of image data in combination with output from at least one of the acceleration sensor, the angular speed sensor, and the angular acceleration sensor that constitute the sensor 70. The pixel determiner 22 can detect the amount of pixel displacement between the plurality of pieces of image data (for example, the first image data and the second image data) for each pixel or each subpixel on the basis of pixel output from the image sensor 11. The pixel determiner 22 can detect the amount of pixel displacement between the plurality of pieces of image data (for example, the first image data and the second image data) for each of the R, G, and B planes on the basis of pixel output from the image sensor 11. In this case, the pixel determiner 22 may use only a specific plane, namely, the R plane, the G plane, or the B plane among the R, G, and B planes or may change the plane to be used. The R, G, and B planes can be flexibly used in such a manner that, for example, the G plane is used in a case of detecting the amount of pixel displacement between certain pieces of image data and the R plane is used in a case of detecting the amount of pixel displacement between the other pieces of image data. The pixel determiner 22 can combine the above-described detection form in which output from the sensor 70 is used with the above-described detection form in which pixel output from the image sensor 11 is used. That is, the pixel determiner 22 can roughly estimate the direction of the amount of pixel displacement by using output from the sensor 70, and thereafter, accurately detect the amount of pixel displacement by using pixel output from the image sensor 11. In a case where a pixel defect or specific-use pixel output is included in pixel output from the image sensor 11, the pixel determiner 22 can make a temporary correction using an existing defective pixel correction method to detect the amount of position displacement. The pixel determiner 22 can exclude the specific-use pixel output or reduce the weight of the specific-use pixel output to detect the amount of pixel displacement. The specific-use pixel output can include, for example, a phase difference detection pixel that does not relate to image capturing.

The pixel determiner 22 obtains, in a case where a defective pixel is included in any piece of image data among the plurality of pieces of image data, a replacement pixel and/or a correction value based on the replacement pixel for replacing the defective pixel on the basis of the amount of pixel displacement between the plurality of pieces of image data and position information about the defective pixel in the piece of image data. That is, the pixel determiner 22 obtains, on the basis of the amount of pixel displacement between the first image data and the second image data and position information about the first pixel in the first image data, a value of the second pixel in the second image data and/or a correction value based on the second pixel. The replacement pixel and/or the correction value are obtained on the basis of the other pieces of image data other than the above-mentioned piece of image data. For example, in a case where a defective pixel (first pixel) is included in the first piece of image data (first image data) among the four pieces of image data obtained for multi-shot combination, the replacement pixel and/or the correction value (second pixel) are obtained on the basis of some or all of the remaining three pieces of image data (second image data).

The pixel determiner 22 performs alignment for matching the plurality of pieces of image data in accordance with the amount of pixel displacement between the plurality of pieces of image data. The pixel determiner 22 sets a pixel of interest at a position common to the plurality of pieces of image data after alignment. For example, the pixel determiner 22 matches a pixel position in the first image data with a pixel position in the second image data in accordance with the amount of position displacement (amount of pixel displacement) between the first image data and the second image data, and sets a pixel of interest at a position common to the first image data and the second image data.

Here, the alignment is an action of subtracting, for the plurality of pieces of image data, the amount of position displacement between the pieces of image data. That is, pixel positions in the respective pieces of image data are matched to obtain position information about a common pixel of interest. The pixels of interest in the respective pieces of image data have a correspondence, and pieces of position information about the pixels of interest in the respective pieces of image data differ but indicate the same position of the object.

Figure 4:
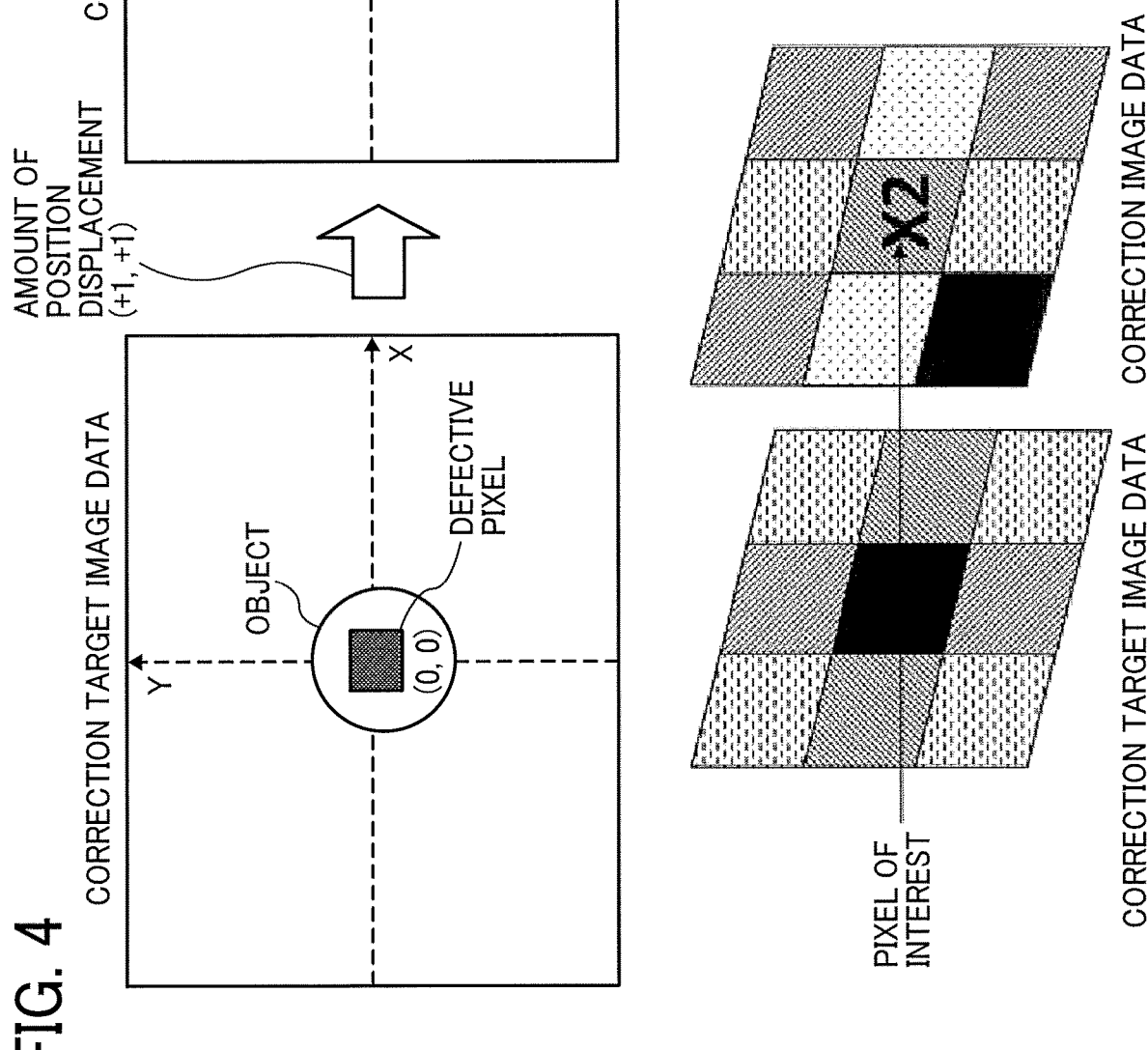
FIG. 4 is a schematic diagram illustrating an example of alignment and setting of a pixel of interest by a pixel determiner.

FIG. 4 is a schematic diagram illustrating an example of alignment and setting of a pixel of interest by the pixel determiner 22. In a case where two pieces of image data are obtained by serial image capturing, one of the pieces of image data is assumed to be the correction target image data, and the other piece of image data that is obtained when the image capturing device is moved in the upper right direction by one pixel (one pixel in the X direction and one pixel in the Y direction) is assumed to be the correction image data. In a case where a defective pixel is present at X1(0, 0) in the correction target image data, the amount of position displacement between the correction target image data and the correction image data is indicated by (+1, +1), and therefore, position information about a pixel, in the correction image data, corresponding to the defective pixel is indicated by X2(1, 1). At this time, the pixel coordinates of the defective pixel in the correction image data are (0, 0). That is, in a case where the pixel X1 indicated by the pixel coordinates (0, 0) in the correction target image data is set as the pixel of interest, the pixel of interest in the correction image data is the pixel X2 indicated by the pixel coordinates (1, 1).

FIG. 5 is a schematic diagram illustrating obtaining of the replacement pixel and/or the correction value by the pixel determiner 22. FIG. 5 illustrates an example state where four pieces of image data obtained for multi-shot combination are aligned, each piece of image data is represented by 3×3 pixels, namely, 9 pixels, and the center pixel in each image is assumed to be the pixel of interest. In FIG. 5, the pixel of interest in the first piece of image data is $R_{00}$, the pixel of interest in the second piece of image data is $G_{12}$, the pixel of interest in the third piece of image data is $G_{22}$, and the pixel of interest in the fourth piece of image data is $B_{30}$. The pixel values after combination for increasing resolution, such as multi-shot combination, are expressed by $R=R_{00}$, $G=(G_{12}+G_{22})/2$, and $B=B_{30}$.

In a case where the pixel of interest in any piece of image data among the plurality of pieces of image data is a defective pixel, the pixel determiner 22 obtains, on the basis of the pixel of interest and/or pixels other than the pixel of interest in the other pieces of image data among the plurality of pieces of image data, a replacement pixel in the other pieces of image data and/or a correction value based on the replacement pixel. For example, in a case where the pixel of interest in the first image data is the first pixel, the pixel determiner 22 obtains, on the basis of the pixel of interest and/or pixels other than the pixel of interest in the second image data, a value of the second pixel in the second image data and/or a correction value based on the second pixel and corrects the first pixel using the value of the second pixel and/or the correction value.

In FIG. 5, in a case where the pixel of interest $R_{00}$ in the first piece of image data is a defective pixel, the first piece of image data is the correction target image data (first image data) and the second to fourth pieces of image data correspond to the correction image data (second image data). The value of R, which is the replacement pixel and/or the correction value, is calculated using the following equation.

$$R=(2R_{10}+2R_{11}+2R_{20}+2R_{21}+R_{30}+R_{31}+R_{32}+R_{33})/12$$

In FIG. 5, in a case where the pixel of interest $G_{12}$ in the second piece of image data is a defective pixel, the second piece of image data is the correction target image data (first image data) and the third piece of image data is the correction image data (second image data). The value of G, which is the replacement pixel and/or the correction value, is calculated using the following equation.

$$G=G_{22}$$

In FIG. 5, in a case where the pixel of interest $G_{22}$ in the third piece of image data is a defective pixel, the third piece of image data is the correction target image data (first image data) and the second piece of image data is the correction image data (second image data). The value of G, which is the replacement pixel and/or the correction value, is calculated using the following equation.

$$G=G_{12}$$

In FIG. 5, in a case where the pixel of interest $B_{30}$ in the fourth piece of image data is a defective pixel, the fourth piece of image data is the correction target image data (first image data) and the first to third pieces of image data correspond to the correction image data (second image data). The value of B, which is the replacement pixel and/or the correction value, is calculated using the following equation.

$$B=(B_{00}+B_{01}+B_{02}+B_{03}+2B_{10}+2B_{11}+2B_{20}+2B_{21})/12$$

In the case where the pixel of interest $G_{12}$ in the second piece of image data is a defective pixel, the pixel determiner 22 extracts the pixel of interest $G_{22}$ in the third piece of image data as the replacement pixel and/or the correction value. In the case where the pixel of interest $G_{22}$ in the third piece of image data is a defective pixel, the pixel determiner 22 extracts the pixel of interest $G_{12}$ in the second piece of image data as the replacement pixel and/or the correction value. As described above, in the case where the pixel of interest in a piece of image data is a defective pixel, the pixel of interest in another piece of image data is extracted as the replacement pixel and/or the correction value, so that the replacement pixel and/or the correction value can be obtained with high accuracy while the computation load of the CPU is reduced. In other words, in a case where the pixel of interest in the first image data is the first pixel, the pixel determiner 22 can extract the pixel of interest in the second image data as the value of the second pixel and/or the correction value.

In the case where the pixel of interest $R_{00}$ in the first piece of image data is a defective pixel, the pixel determiner 22 calculates the replacement pixel and/or the correction value on the basis of a group of pixels adjacent to the pixel of interest in the second to fourth pieces of image data. In the case where the pixel of interest $B_{30}$ in the fourth piece of image data is a defective pixel, the pixel determiner 22 calculates the replacement pixel and/or the correction value on the basis of a group of pixels adjacent to the pixel of interest in the first to third pieces of image data. As described above, in the case where the pixel of interest in a piece of image data is a defective pixel, the replacement pixel and/or the correction value are calculated on the basis of a group of pixels adjacent to the pixel of interest in the other pieces of image data, so that the replacement pixel and/or the correction value can be obtained with high accuracy while the computation load of the CPU is reduced. In other words, in the case where the pixel of interest in the first image data is the first pixel, the pixel determiner 22 can calculate the value of the second pixel and/or the correction value on the basis of a group of pixels adjacent to the pixel of interest in the second image data.

Figure 6:
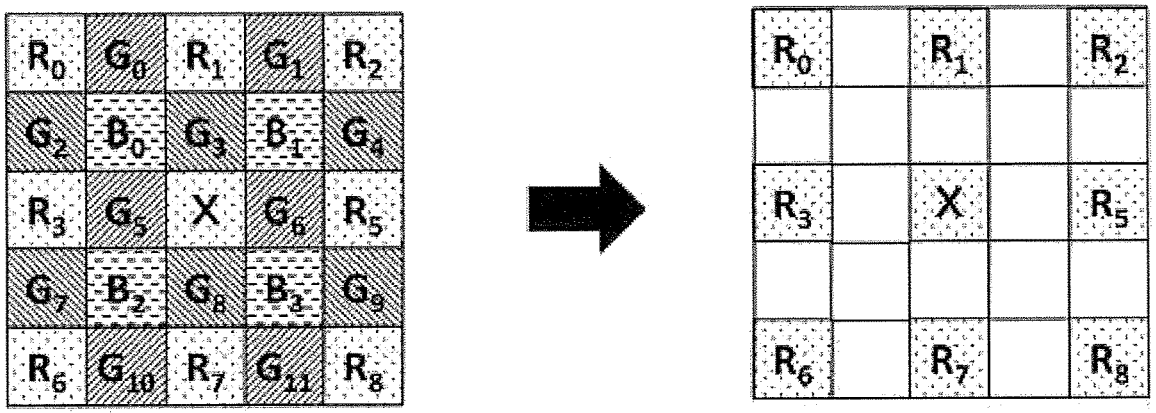
FIG. 6 is a schematic diagram illustrating a method for calculating a replacement pixel in existing typical pixel interpolation.

FIG. 6 is a schematic diagram illustrating a method for calculating a replacement pixel in existing typical pixel interpolation (pixel correction). In a case where one piece of image data has a defective pixel, the replacement pixel is calculated on the basis of the other pixels of the same color in the one piece of image data, and the defective pixel is corrected using the replacement pixel. In FIG. 6, one piece of image data is represented by 5×5 pixels, namely, 25 pixels, and the replacement pixel for the center pixel X (which is assumed to be a defective R pixel), is calculated using the following equation.

$$X=(R_0+2R_1+R_2+2R_3+2R_5+R_6+2R_7+R_8)/12$$

The Bayer primary color filter included in the image sensor element in the image sensor is an aggregate of red (R), green (G (Gr, Gb)), and blue (B) filters, and the filter of the same color is arranged on every other pixel in both the vertical direction and the horizontal direction. Therefore, as illustrated in FIG. 6, in existing typical pixel interpolation, the replacement pixel is calculated by referencing the pixels of the same color that are not adjacent to the defective pixel but away from the defective pixel (located at distant positions), and a correction error, such as spurious resolution, a false color, or a moire pattern, is likely to occur, which is a problem.

Figure 7:
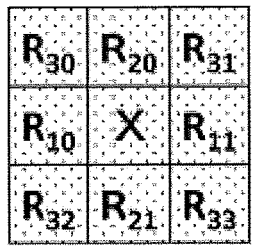
FIG. 7 is a schematic diagram illustrating a method for calculating a replacement pixel in pixel interpolation according to the first embodiment.

On the other hand, in the first embodiment, as illustrated in FIG. 7, a piece of image data having a defective pixel and the other pieces of image data are referenced, and pixels of the same color that are adjacent to the defective pixel so as to surround the defective pixel are collected, and the replacement pixel and/or the correction value are calculated. Accordingly, a correction error, such as spurious resolution, a false color, or a moire pattern, can be prevented, and the replacement pixel and/or the correction value that are highly reliable can be obtained.

The pixel interpolation of the first embodiment illustrated in FIG. 7 can be performed after existing typical pixel interpolation illustrated in FIG. 6 has been performed. In a case where a defective pixel is present in an area to be referenced (hereinafter referred to as a referenced area or a referenced region) in the other pieces of image data (a defective pixel is included in the referenced area after a pixel shift), the replacement pixel and/or the correction value can be calculated without using the defective pixel. The referenced area (referenced region) can be set as appropriate.

The method for obtaining the replacement pixel and/or the correction value performed by the pixel determiner 22 described above is merely an example. Instead of or in addition to this correction method, other existing methods for highly efficient pixel defect correction or pixel interpolation using replacement with the closest pixel, differences in the output directions of the surrounding pixels, the ratios relative to the other colors, etc. can be used. That is, in the case where a defective pixel is included in a piece of image data, the method for obtaining the replacement pixel and/or the correction value can be flexibly designed, and various design changes can be made to the method as long as the replacement pixel and/or the correction value are obtained on the basis of the other pieces of image data.

The corrector 23 uses the replacement pixel and/or the correction value obtained by the pixel determiner 22 to correct the defective pixel in the image data detected by the pixel determiner 22. That is, the corrector 23 uses the replacement pixel and/or the correction value (value of the second pixel) to correct the value of the first pixel. Accordingly, the image data in which the defective pixel is restored with high accuracy can be obtained. For example, a defective pixel in four pieces of image data obtained for multi-shot combination is restored with high accuracy, so that a combined image having excellent image quality can be obtained.

The combiner 24 combines the plurality of pieces of image data in which the defective pixel is corrected by the corrector 23 as necessary to obtain combined image data. That is, the combiner 24 performs multi-shot combination for combining a plurality of pieces of image data obtained while the image sensor 11 is moved by a pixel unit (for example, by one pixel), that is, vibrated by a very small amount, to obtain combined image data. In the combined image data obtained by the combiner 24, the defective pixel present in the original image data (for example, the first or second image data) is satisfactorily corrected, so that the combined image data can have very high quality.

In a case where an image surface phase difference correction pixel that corresponds to one color among R, G, and B is set in any piece of image data among the plurality of pieces of image data, when another pixel of the same color is relatively moved to the original position of the image surface phase difference correction pixel in association with relative movement of the image sensor 11 by a pixel unit, the replacer 25 performs replacement with the other pixel of the same color. That is, in a case where an image surface phase difference correction pixel that corresponds to one color among R, G, and B is set in the first image data and/or the second image data, when another pixel of the same color is relatively moved to the original position of the image surface phase difference correction pixel, the replacer 25 performs replacement with the other pixel.

Figure 8:
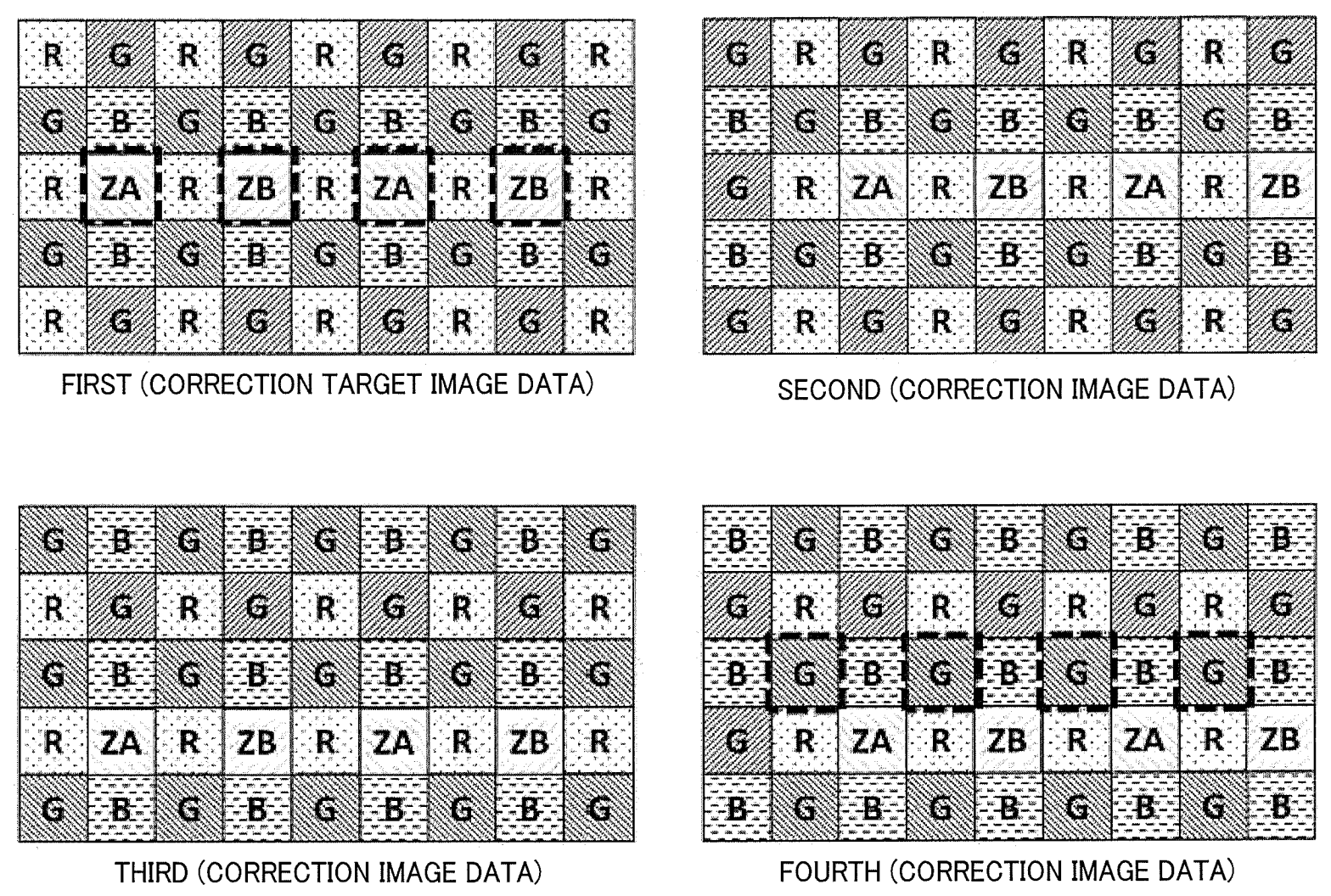

FIG. 8 is a schematic diagram illustrating pixel replacement by the replacer 25. In FIG. 8, in the first piece of image data (correction target image data or first image data) and in the second to fourth pieces of image data (correction image data or second image data), image surface phase difference correction pixels ZA and ZB are set. In the first piece of image data (correction target image data or first image data), the image surface phase difference correction pixels ZA and ZB correspond to color G among R, G, and B. When other pixels of color G are relatively moved to the original positions of the image surface phase difference correction pixels ZA and ZB in the fourth piece of image data (correction image data or second image data), replacement with the other pixels of color G is performed.

In the digital camera 1 of the first embodiment, images are captured while the image sensing surface of the image sensor 11 is moved relative to a light flux from the object by a pixel unit to obtain a plurality of pieces of image data. That is, the camera unit 10 and the image sensor 11 function as "obtainer" that obtains the first image data and the second image data while the image sensing surface of the image sensor 11 is moved relative to a light flux from the object by a pixel unit. However, in a case where the pixel unit for the relative movement is not set to an appropriate size, a plurality of defective pixels including a reference pixel may be present in the referenced region that is located around the reference pixel (that is, the defective pixel is copied around), and it may be difficult to restore the defective pixel with high accuracy.

Figure 9:
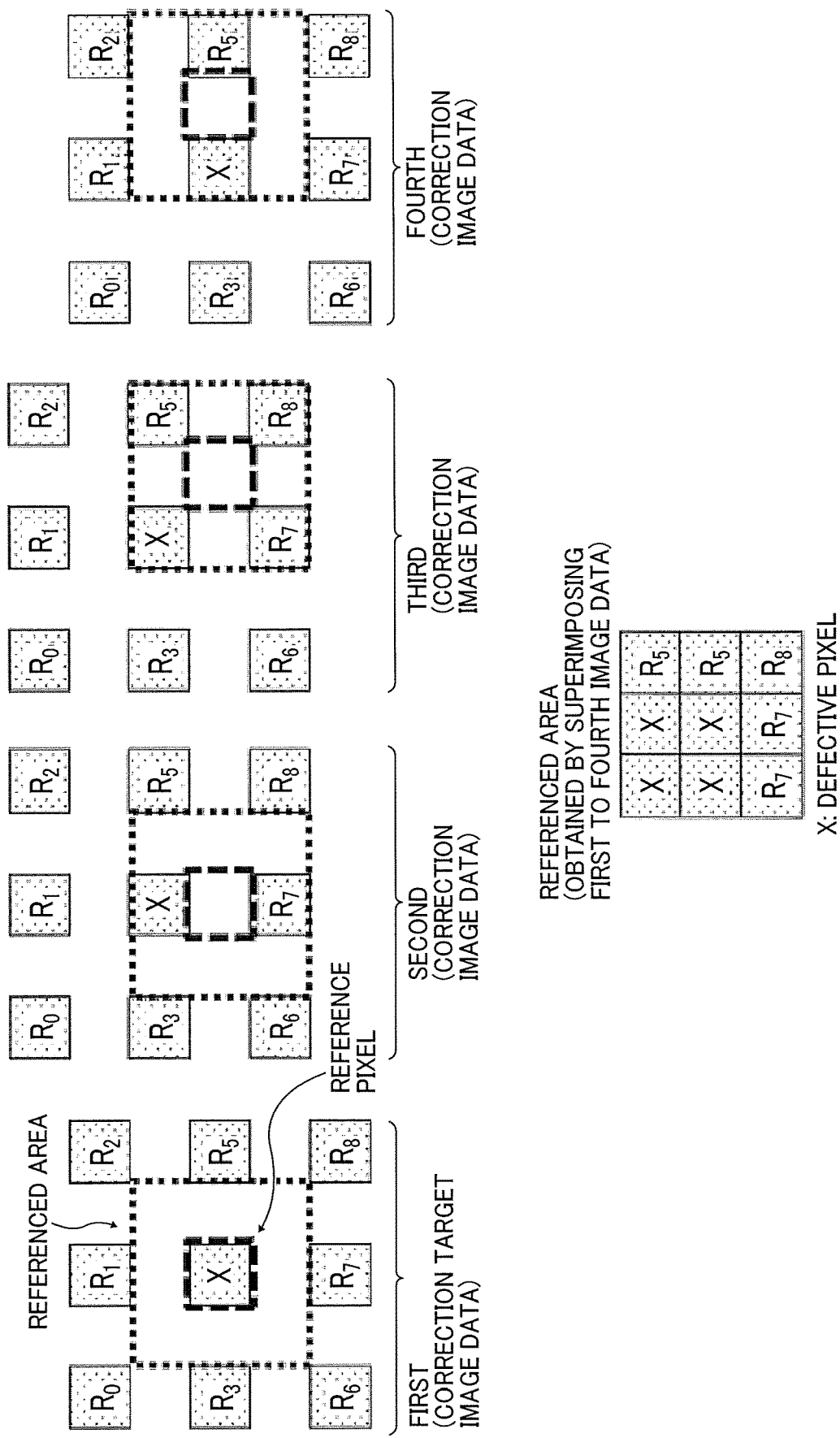
FIG. 9 is a schematic diagram illustrating a plurality of pieces of image data obtained while an image sensor is moved by one pixel and copying of a defective pixel.

FIG. 9 is a schematic diagram illustrating a plurality of pieces of image data obtained while the image sensor 11 is moved by one pixel and copying of a defective pixel. The first piece of image data is assumed to be the correction target image data. The second piece of image data is the correction image data obtained when the image sensor 11 is moved upward by one pixel. The third piece of image data is the correction image data obtained when the image sensor 11 is further moved leftward by one pixel. The fourth piece of image data is the correction image data obtained when the image sensor 11 is further moved downward by one pixel. In a case where these four pieces of image data are input to the image processing device 20 for a correction process, in the referenced area around a reference pixel (defective pixel), many defective pixels (four defective pixels including the reference pixel) are included, and therefore, the replacement pixel and/or the correction value might not be correctly calculated, and it may be difficult to restore the defective pixel with high accuracy.

Figure 10:
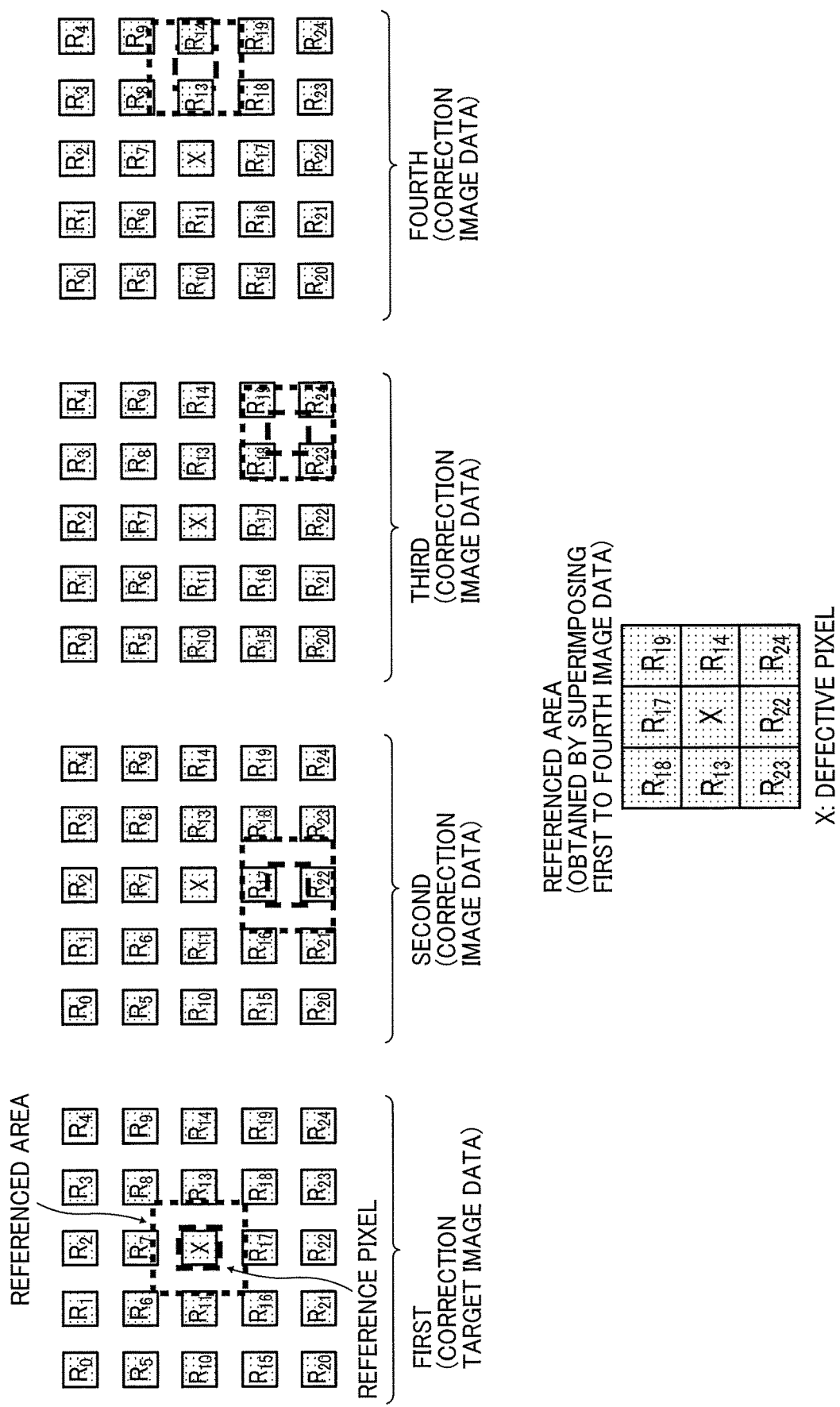
FIG. 10 is a schematic diagram illustrating a plurality of pieces of image data obtained while an image sensor is moved by three pixels and copying of a defective pixel.

The CPU (controller) 90 of the digital camera 1 controls the size of the pixel unit by which the image sensor 11 is relatively moved so that, in a plurality of pieces of image data, a plurality of defective pixels including a reference pixel are not present in the referenced region that is located around the reference pixel. Specifically, the CPU (controller) 90 of the digital camera 1 controls the size of the pixel unit so that, in the first image data and the second image data, a plurality of defective pixels including a reference pixel are not present in the referenced region that is located around the reference pixel. For example, as illustrated in FIG. 10, the size of the pixel unit by which the image sensor 11 is relatively moved can be controlled and set to a three-pixel pitch. In FIG. 10, in the referenced area around the reference pixel (defective pixel) obtained by superimposing the first to fourth pieces of image data, only the single defective pixel is included (the defective pixel is not copied into the referenced region). Therefore, the replacement pixel and/or the correction value are correctly calculated, so that the defective pixel can be restored with high accuracy.

In the example in FIG. 10, the size of the pixel unit by which the image sensor 11 is relatively moved is controlled and set to a three-pixel pitch; however, the way of controlling the size of the pixel unit can be flexibly designed, and various design changes can be made. That is, the size of the pixel unit for relative movement can be changed as appropriate in accordance with, for example, the referenced area, pixel size, movement cycle, etc. of the image sensor 11 as long as a plurality of defective pixels including a reference pixel are not present in the referenced region that is located around the reference pixel in the plurality of pieces of image data.

In the above description, as pixels of the image sensor 11, the "pixel of interest" that is used to detect and correct a defective pixel and the "reference pixel" that is used to drive and control the image sensor 11 so that a plurality of defective pixels are not present are described. The "pixel of interest" and the "reference pixel" are concepts based on different technical ideas, and may be the same pixel or may be different pixels.

Figure 11:
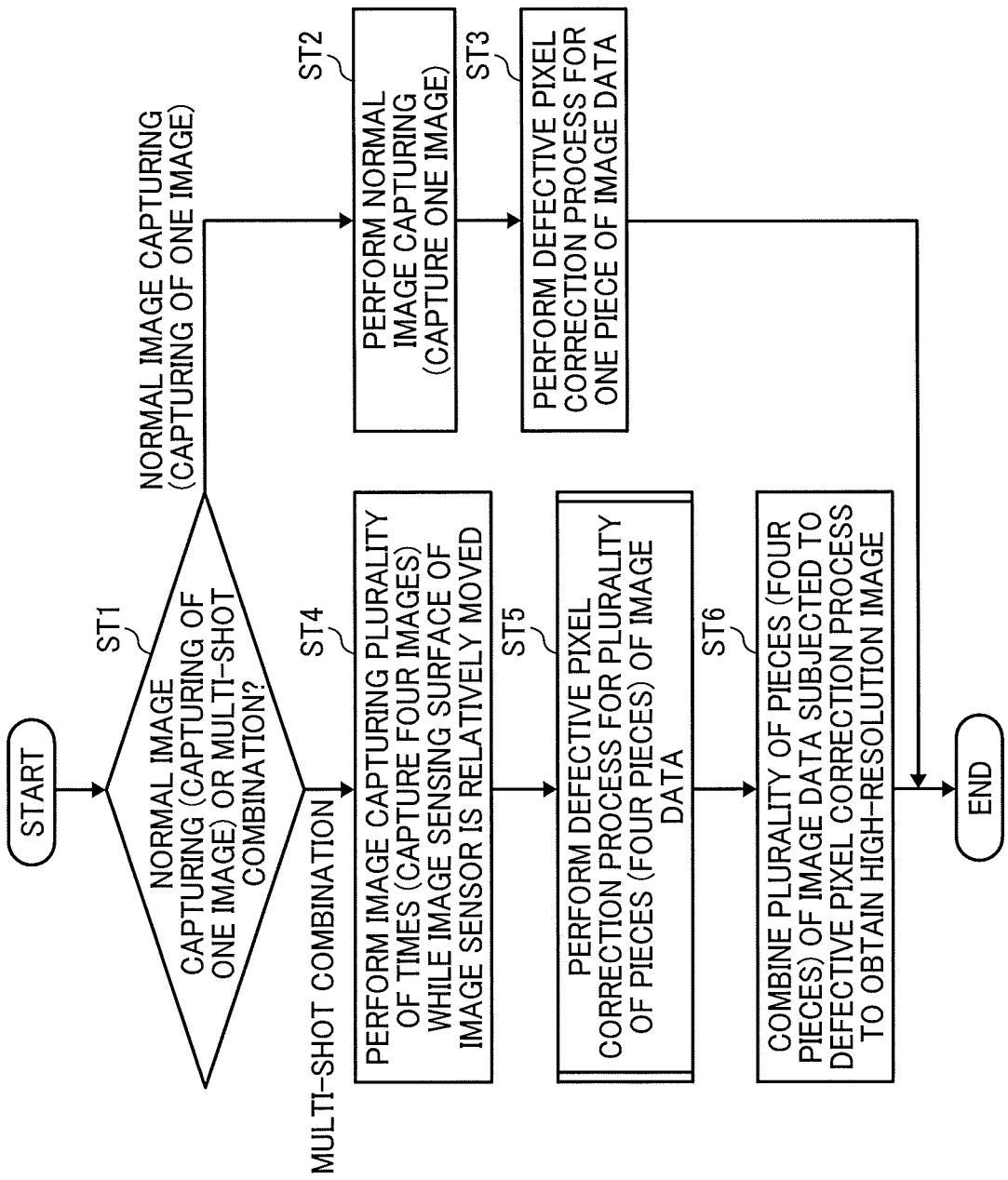
FIG. 11 is a flowchart illustrating an image capturing process performed by a digital camera according to the first embodiment.

FIG. 11 is a flowchart illustrating an image capturing process performed by the digital camera 1 according to the first embodiment.

In step ST1, it is determined whether normal image capturing (capturing of one image) or multi-shot combination is to be performed. In a case of normal image capturing (capturing of one image), the flow proceeds to step ST2. In a case of multi-shot combination, the flow proceeds to step ST4.

In step ST2, normal image capturing (capturing of one image) is performed to obtain one piece of image data.

In step ST3, a defective pixel correction process is performed for the one piece of image data obtained in step ST2. That is, it is determined whether a defective pixel is present in the one piece of image data. In a case where a defective pixel is present, the replacement pixel is calculated on the basis of the other pixels of the same color in the one piece of image data, and the defective pixel is corrected with the replacement pixel (see FIG. 6). Even in the case where one piece of image data is obtained in normal image capturing, if a piece of image data (another piece of image data) that can be used as the correction image data is present in a data storage unit or included in obtained pieces of image data, a defective pixel correction process based on pixels in the other piece of image data according to the present embodiments may be performed.

In step ST4, image capturing is performed a plurality of times (for example, four times) while the image sensing surface of the image sensor 11 is moved relative to a light flux from the object by a pixel unit to thereby obtain a plurality of pieces (for example, four pieces) of image data.

In step ST5, a defective pixel correction process is performed for the plurality of pieces (four pieces) of image data obtained in step ST4. This defective pixel correction process will be described in detail below as a subroutine.

In step ST6, the plurality of pieces (four pieces) of image data subjected to the defective pixel correction process are combined to obtain a high-resolution image.

When the defective pixel correction process according to the first embodiment is the point, the image combining step in step ST6 need not be performed and may be omitted.

Figure 12:
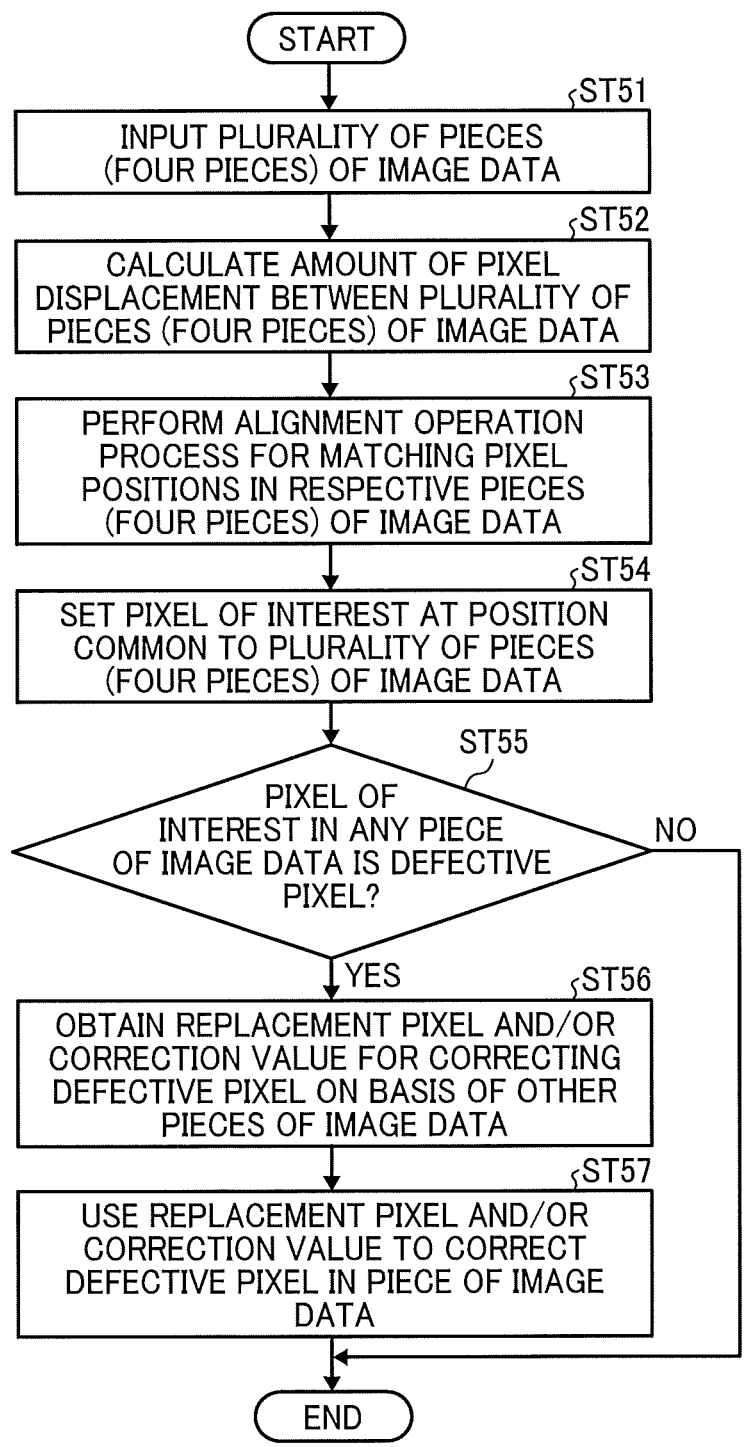
FIG. 12 is a flowchart illustrating a defective pixel correction process in a step in FIG. 11.

FIG. 12 is a flowchart illustrating the defective pixel correction process in step ST5 in FIG. 11.

In step ST51, the plurality of pieces (four pieces) of image data obtained in step ST4 are input to the inputter 21 of the image processing device 20. The plurality of pieces of image data input to the inputter 21 of the image processing device 20 may be those obtained by the camera unit 10 as described in the first embodiment or may be those selected and extracted from a place, such as a specified folder, a cloud storage unit, or a video, in which a group of recorded images is present. Alternatively, the plurality of pieces of image data input to the inputter 21 of the image processing device 20 need not be obtained by using the anti-shake unit 80 (by actively moving the image sensor 11) but may be those obtained by "multi-shot combination using camera shake" that is performed using an image blur in each shot due to camera shake (vibration) caused by the person taking the shot.

In step ST52, the amount of pixel displacement (amount of position displacement) between the plurality of pieces (four pieces) of image data is calculated.

In step ST53, an alignment operation process for matching pixel positions in the respective pieces (four pieces) of image data is performed in accordance with the amount of pixel displacement calculated in step ST52. In this alignment operation process, the pieces of image data need not be actually superimposed, and the operation needs to be performed on the supposition that the pieces of image data are superimposed.

In step ST54, a pixel of interest is set at a position common to the plurality of pieces (four pieces) of image data.

In step ST55, it is determined whether the pixel of interest in any piece of image data among the plurality of pieces (four pieces) of image data is a defective pixel. In a case where none of the pixels of interest are defective pixels (No in step ST55), the defective pixel correction process ends, and the flow returns to the main flow. In a case where a pixel of interest among the pixels of interest is a defective pixel (Yes in step ST55), the flow proceeds to step ST56.

In step ST56, a replacement pixel and/or a correction value for correcting the defective pixel are obtained on the basis of the pixel of interest and/or pixels other than the pixel of interest in the pieces of image data other than the piece of image data in which the defective pixel is present.

In step ST57, the replacement pixel and/or the correction value obtained in step ST56 are used to correct the defective pixel in the piece of image data.

A matching process for determining whether the defective pixel correction process according to the first embodiment is suitable to the plurality of pieces of image data input to the image processing device 20 may be inserted between step ST51 and step ST52 in the flowchart illustrated in FIG. 12. A selection process (separation process) for selecting (separating) some of the plurality of pieces of image data in accordance with the amount of pixel displacement between the plurality of pieces of image data may be inserted between step ST53 and step ST54 in the flowchart illustrated in FIG. 12. The matching process and/or the selection process may or may not be performed in a flexible manner in accordance with the number of pieces of image data, the image capture environment, etc.

The alignment operation process can be performed each time an image or pixels are read. However, alignment between the plurality of images does not change regardless of the read image, and therefore, the alignment operation process is performed immediately after the plurality of pieces of image data are input, so that the computation load can be reduced. Defective pixel correction (writing of defective pixel data to the correction target image data) may be performed at an appropriate timing, such as after calculation of the correction values for all images or after calculation of the correction values for all defective pixels in any of the pieces of image data.

A criterion for determining an appropriate amount of position displacement used to select combination target images in a case of image combination may be different from a criterion for determining an appropriate amount of position displacement used to extract correction values for a defective pixel. That is, the combination target images and correction images (images from which the correction values are extracted) need not be the same. In a case where a more suitable combination target image is included in the plurality of images or in a case where an image that is not appropriate as a combination target image in terms of the amount of position displacement but is appropriate as an image from which a correction value is extracted is present, such an image and the amount of position displacement can be used to extract correction values, and the image that is most effective as a combination target image and the amount of position displacement can be used to perform image combination.

When the correction target image data is subjected to a combination process, an image other than the correction images used to correct the defective pixel can be used as a combination target image to obtain a higher-resolution image. Specifically, a plurality of data sets each constituted by a plurality of images are prepared, one of the images for which a defective pixel is to be corrected is set as a correction target image in each of the data sets, and the other images are used as correction images to correct the defective pixel. When the plurality of pieces of correction target image data similarly corrected in the respective data sets are combined with each other, a high-resolution image can be obtained. In this case, the plurality of pieces of correction target image data need to be images that each function as a reference image or a combination target image. In a case where many images that can be extracted as combination target images are present (for example, in a case of consecutive image capturing), the above-described configuration is effective.

As described above, in the image capturing device, the image capturing method, the image capturing program, the image processing device, the image processing method, and the image processing program according to the first embodiment, the first image data and the second image data are input to the inputter 21, the pixel determiner 22 determines the second pixel included in the second image data and corresponding to the first pixel included in the first image data, and the corrector 23 uses the value of the second pixel to correct the value of the first pixel. Accordingly, high-quality image data can be obtained. In particular, in a case of multi-shot combination, high-quality combined image data can be obtained.

In an existing typical defective pixel correction technique, a pixel that replaces a defective pixel is not present. In the first embodiment, image capturing is performed a plurality of times for, for example, multi-shot combination, and a plurality of pieces of image data in which the position relationship between the object and a defective pixel differs are obtained. Therefore, in a case of correcting a defective pixel in a piece of image data, the replacement pixel and/or the correction value are obtained from output from corresponding normal pixels in the other pieces of image data and used to correct the defective pixel, so that the defective pixel can be restored with high accuracy. Among the plurality of pieces of image data that are input, the correction image data and the correction target image data can be changed to correct a defective pixel in each of the pieces of image data. Therefore, defective pixels in the plurality of pieces of image data that are obtained can be restored with high accuracy, and a higher-resolution combined image can be obtained even in a case of multi-shot combination.

Figure 13:
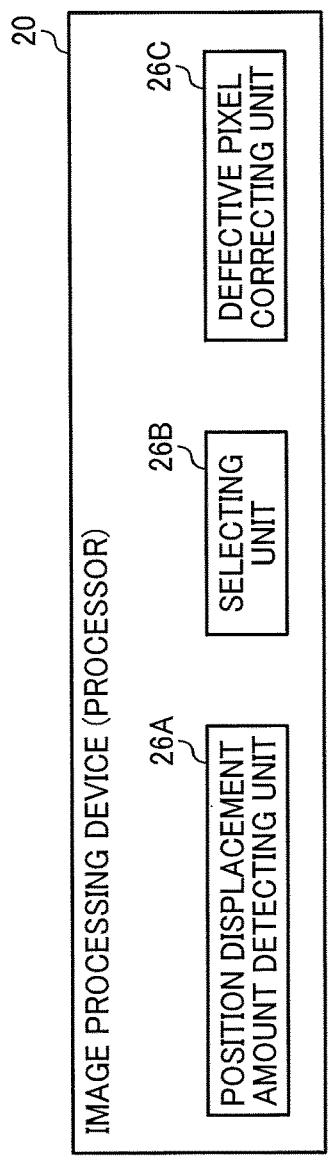
FIG. 13 is a functional block diagram illustrating another example of the internal configuration of the image processing device (processor)

FIG. 13 is a functional block diagram illustrating another example of the internal configuration of the image processing device (processor) 20. The functional block diagram illustrated in FIG. 13 can be regarded as the functional block diagram illustrated in FIG. 3 viewed from another viewpoint.

As illustrated in FIG. 13, the image processing device (processor) 20 includes a position displacement amount detecting unit 26A, a selecting unit 26B, and a defective pixel correcting unit 26C.

The position displacement amount detecting unit 26A detects the amount of position displacement between pieces of image data (for example, between the first image data and the second image data).

The selecting unit 26B selects correction target image data and correction image data in accordance with the amount of position displacement detected by the position displacement amount detecting unit 26A. Alternatively, the selecting unit 26B selects a reference image and a combination target image from among the plurality of images in accordance with the amount of position displacement detected by the position displacement amount detecting unit 26A, assumes the reference image data or the combination target image data that includes a defective pixel as correction target image data, and selects correction image data from among the plurality of images in accordance with the correction target image data and the amount of position displacement.

The defective pixel correcting unit 26C changes the defective pixel in the correction target image on the basis of the amount of position displacement detected by the position displacement amount detecting unit 26A and the correction image data selected by the selecting unit 26B.

On the basis of the amount of position displacement detected by the position displacement amount detecting unit 26A, the correction target image data and the correction image data can be combined. Alternatively, on the basis of the amount of position displacement detected by the position displacement amount detecting unit 26A, the reference image and the combination target image can be combined.

As described above, the amount of position displacement between a plurality images is calculated, and a combination target image and a reference image are selected on the basis of the amount of position displacement. In a case where a defective pixel is present in at least one of the combination target image and the reference image, a correction image is selected in accordance with the amount of position displacement to correct the defective pixel in the image (that is, the correction target image). In this case, the correction image need not be the combination target image or the reference image.

Second Embodiment

A second embodiment is described with reference to FIG. 14 to FIG. 16. Regarding matters that overlap those in the first embodiment, descriptions thereof will be omitted.

Figure 14:
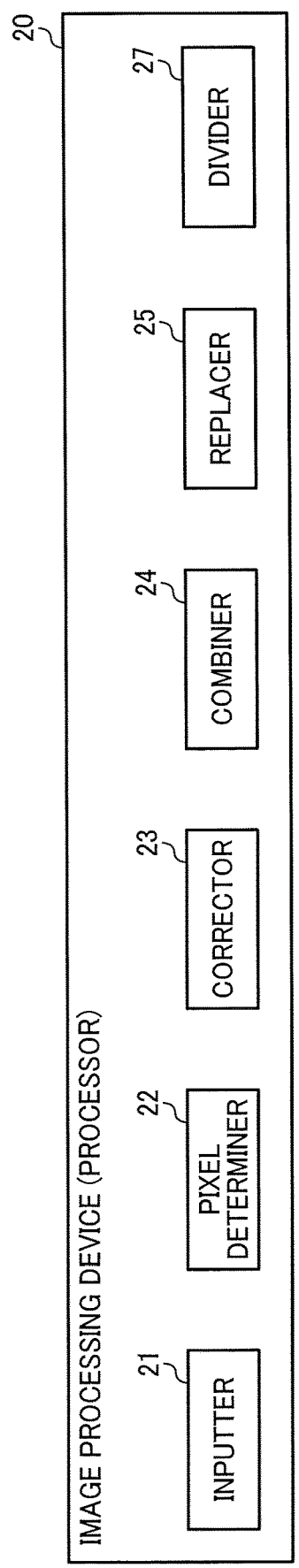
FIG. 14 is a functional block diagram illustrating the internal configuration of the image processing device (processor) according to a second embodiment.

As illustrated in FIG. 14, the image processing device (processor) 20 includes a divider 27 in addition to the inputter 21, the pixel determiner 22, the corrector 23, the combiner 24, and the replacer 25.

The divider 27 divides each of the plurality of images into image regions so that the image regions of each of the images correspond to the image regions of the other images. FIGS. 15A to 15D are diagrams illustrating an example case where a plurality of images are each divided into image regions so that the image regions of each of the images correspond to the image regions of the other images. In FIG. 15A, the first image is divided into image regions 1-1, 1-2, ..., 1-N in a matrix, the image regions having the same longitudinal and lateral sizes. In FIG. 15B, the second image is divided into image regions 2-1, 2-2, ..., 2-N in a matrix, the image regions having the same longitudinal and lateral sizes. In FIG. 15C, the third image is divided into image regions 3-1, 3-2, ..., 3-N in a matrix, the image regions having the same longitudinal and lateral sizes. In FIG. 15D, the fourth image is divided into image regions 4-1, 4-2, ..., 4-N in a matrix, the image regions having the same longitudinal and lateral sizes. The block size of each image region can be flexibly set and, for example, can be set to 128 pixels×128 pixels.

The pixel determiner 22 (FIG. 3) or the position displacement amount detecting unit 26A (FIG. 13) detects the amount of position displacement (amount of pixel displacement) for each set of corresponding image regions in the plurality of images. A description is given with reference to the example illustrated in FIGS. 15A to 15D. The pixel determiner 22 or the position displacement amount detecting unit 26A calculates the amount of position displacement (amount of pixel displacement) for the image region 1-1 in the first image, the image region 2-1 in the second image, the image region 3-1 in the third image, and the image region 4-1 in the fourth image. The pixel determiner 22 or the position displacement amount detecting unit 26A calculates the amount of position displacement (amount of pixel displacement) for the image region 1-2 in the first image, the image region 2-2 in the second image, the image region 3-2 in the third image, and the image region 4-2 in the fourth image. The pixel determiner 22 or the position displacement amount detecting unit 26A calculates the amount of position displacement (amount of pixel displacement) for the image region 1-N in the first image, the image region 2-N in the second image, the image region 3-N in the third image, and the image region 4-N in the fourth image. Accordingly, the pixel determiner 22 or the position displacement amount detecting unit 26A computes a correlation between blocks located at the same positions in the respective images by performing, for example, sub-pixel estimation.

The pixel determiner 22 (FIG. 3) or the selecting unit 26B (FIG. 13) selects a combination target image region from the plurality of images on the basis of the amount of position displacement (amount of pixel displacement), which is the correlation value detected by the pixel determiner 22 (FIG. 3) or the position displacement amount detecting unit 26A (FIG. 13). For example, the pixel determiner 22 or the selecting unit 26B sets the image regions of any of the images as reference image regions, sets the image regions of each of the other images as comparison image regions, and selects comparison image regions for each of which the amount of position displacement (amount of pixel displacement) from a corresponding one of the reference image regions is within a predetermined threshold, smallest, and odd-numbered pixels or even-numbered pixels as combination target image regions. For example, in a case where the image regions 1-1 to 1-N of the first image illustrated in FIG. 15A are set as reference image regions, at least one of the image regions 2-1, 3-1, and 4-1 can be selected as a combination target image region for the reference image region 1-1, at least one of the image regions 2-2, 3-2, and 4-2 can be selected as a combination target image region for the reference image region 1-2, and at least one of the image regions 2-N, 3-N, and 4-N can be selected as a combination target image region for the reference image region 1-N.

The combiner 24 (FIG. 3) or the defective pixel correcting unit 26C (FIG. 13) obtains a combined image on the basis of the amount of position displacement (amount of pixel displacement), which is the correlation value, detected by the pixel determiner 22 (FIG. 3) or the position displacement amount detecting unit 26A (FIG. 13) and the combination target image regions selected by the pixel determiner 22 (FIG. 3) or the selecting unit 26B (FIG. 13). The combiner 24 or the defective pixel correcting unit 26C performs, in accordance with the amount of position displacement (amount of pixel displacement), which is the correlation value, detected by the pixel determiner 22 or the position displacement amount detecting unit 26A, an image operation for the combination target image regions selected by the pixel determiner 22 or the selecting unit 26B to obtain a combined image. For example, the combiner 24 or the defective pixel correcting unit 26C combines a combination target image region selected by the pixel determiner 22 or the selecting unit 26B from among the comparison image regions 2-1 to 4-1 illustrated in FIG. 15B to FIG. 15D with the reference image region 1-1 illustrated in FIG. 15A, or replaces the reference image region 1-1 illustrated in FIG. 15A with a combination target image region selected by the pixel determiner 22 or the selecting unit 26B from among the comparison image regions 2-1 to 4-1 illustrated in FIG. 15B to FIG. 15D. The combiner 24 or the defective pixel correcting unit 26C combines a combination target image region selected by the pixel determiner 22 or the selecting unit 26B from among the comparison image regions 2-2 to 4-2 illustrated in FIG. 15B to FIG. 15D with the reference image region 1-2 illustrated in FIG. 15A, or replaces the reference image region 1-2 illustrated in FIG. 15A with a combination target image region selected by the pixel determiner 22 or the selecting unit 26B from among the comparison image regions 2-2 to 4-2 illustrated in FIG. 15B to FIG. 15D. The combiner 24 or the defective pixel correcting unit 26C combines a combination target image region selected by the pixel determiner 22 or the selecting unit 26B from among the comparison image regions 2-N to 4-N illustrated in FIG. 15B to FIG. 15D with the reference image region 1-N illustrated in FIG. 15A, or replaces the reference image region 1-N illustrated in FIG. 15A with a combination target image region selected by the pixel determiner 22 or the selecting unit 26B from among the comparison image regions 2-N to 4-N illustrated in FIG. 15B to FIG. 15D.

Accordingly, the combiner 24 or the defective pixel correcting unit 26C performs, for each of the plurality of image regions obtained as a result of division by the divider 27, the image operation (combination or replacement) using a corresponding combination target image region obtained by the pixel determiner 22 or the position displacement amount detecting unit 26A working together with the pixel determiner 22 or the selecting unit 26B to thereby obtain one combined image.

That is, each reference image region in one reference image is combined or replaced with a combination target image region selected from the corresponding comparison image regions of the other comparison images. For example, the reference image region 1-1 in the first image, which is the reference image, can be combined or replaced with the combination target image region 2-1 in the second image, the reference image region 1-2 in the first image can be combined or replaced with the combination target image region 3-2 in the third image, and the reference image region 1-N in the first image can be combined or replaced with the combination target image region 4-N in the fourth image.

In a case where selection of an appropriate combination target image region from the comparison image regions of the comparison images fails for a certain reference image region in the reference image, the reference image region need not be combined or replaced and may be used as is.

Figure 16:
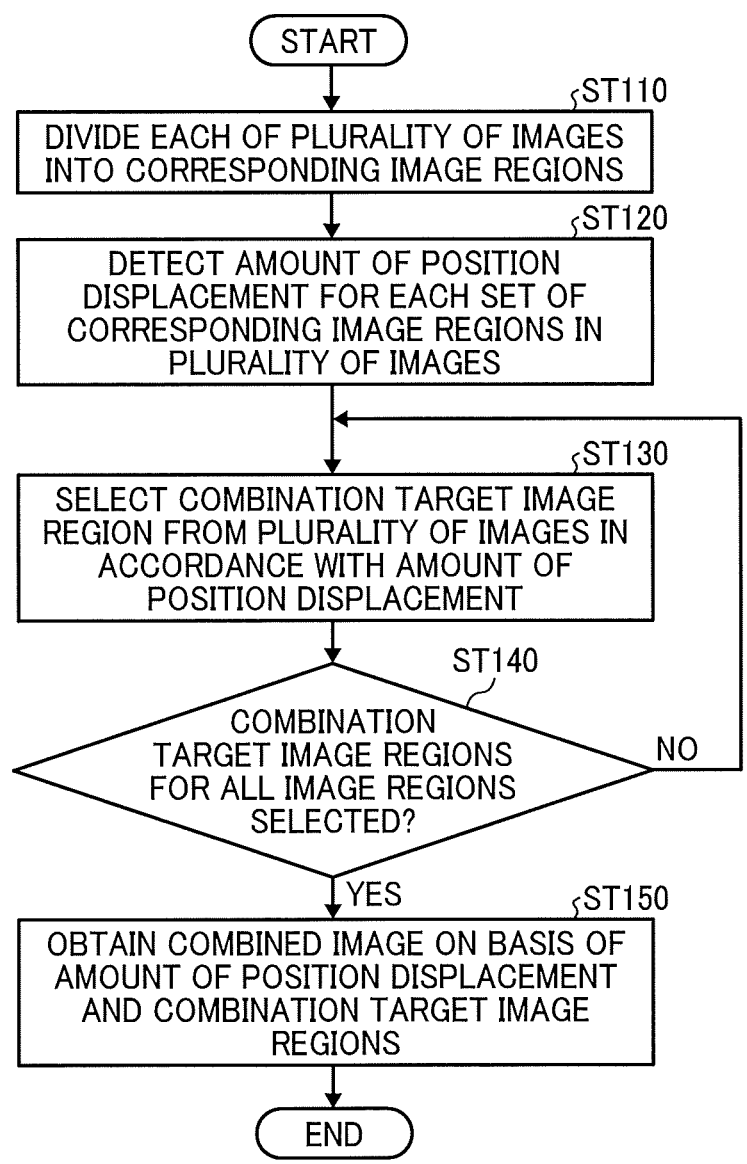
FIG. 16 is a flowchart illustrating an example image capturing process according to the second embodiment.

FIG. 16 is a flowchart illustrating an example image capturing process according to the second embodiment.

In step ST110, a plurality of images are each divided into image regions so that the image regions of each of the images correspond to the image regions of the other images.

In step ST120, the amount of position displacement (amount of pixel displacement) for each set of corresponding image regions in the plurality of images is detected.

In step ST130, a combination target image region is selected from the plurality of images in accordance with the amount of position displacement (amount of pixel displacement), which is a correlation value.

In step ST140, it is determined whether combination target image regions for all of the image regions are selected. In a case where combination target image regions for all of the image regions are not selected (No in step ST140), the flow returns to step ST130, and the process in step ST130 and step ST140 is repeated until combination target image regions for all of the image regions are selected. In a case where combination target image regions for all of the image regions are selected (Yes in step ST140), the flow proceeds to step ST150.

In step ST150, a combined image is obtained on the basis of the amount of position displacement (amount of pixel displacement), which is the correlation value, and the selected combination target image regions.

In the second embodiment described above, a plurality of images are each divided into image regions so that the image regions of each of the images correspond to the image regions of the other images, the amount of position displacement for each set of corresponding image regions in the plurality of images is detected, combination target image regions are selected from the plurality of images in accordance with the amount of position displacement, and a combined image is obtained on the basis of the amount of position displacement and the combination target image regions. Therefore, image quality higher than that provided in the first embodiment, in which the amount of position displacement is detected on a per image basis, a combination target image is selected, and a combined image is obtained, can be provided (that is, higher resolution and reduction of the occurrence of a moire pattern, a false color, and high-speed noise can be achieved).

In the first embodiment, some pixels in an image are corrected (replaced), which is one of the features of the first embodiment. That is, when an image has a defective pixel, the position of a pixel corresponding to the defective pixel in another image needs to be determined. Therefore, unlike the second embodiment, one image need not be divided into a plurality of image regions to find a combination target image. For example, in a case where multi-shot combination in which the image sensor is relatively moved by one pixel is assumed, the amount of position displacement for each image need not be determined with high accuracy. On the other hand, in a case of determining the position of the pixel from pixel information about an image captured in a camera shake state without using information from the camera body (for example, information from the image sensor) (for example, in a case of multi-shot combination using camera shake), it may be difficult to determine a region without calculating the amount of displacement for each small block with sub-pixel precision.

For example, a case is assumed where, as a process to be performed before the process for correcting (replacing) some pixels in an image in the present embodiments, the amount of position displacement between a plurality of images is detected and relative movement and combination are performed. For example, it is possible to detect the amount of position displacement between a plurality of images, select a combination target image from among the plurality of image in accordance with the amount of position displacement, and obtain a combined image on the basis of the amount of position displacement and the combination target image. That is, it is possible to detect the amount of pixel displacement between a plurality of images, set one of the plurality of images as a reference image and the remaining images as comparison images, select a combination target image from among the comparison images in accordance with the amount of pixel displacement between the reference image and each of the comparison images, relatively move the reference image and the combination target image in accordance with the amount of position displacement, and obtain a combined image.

When the correction target image and the correction image according to the present application are applied to the reference image and the comparison images (combination target image) described above, a high-quality image obtained by correcting (replacing) the correction target image using a pixel (second pixel) in the correction image, the pixel being located at a position corresponding to a defective pixel (first pixel) in the correction target image, can be obtained. When a defective pixel in each image is corrected, and thereafter, the correction image and the correction target image are combined, a high-resolution image in which the defective pixels are corrected can be obtained.

In the second embodiment, the case has been illustrated and described where each image is divided into a plurality of image regions, pairing is performed for the image regions, and the comparison operation is performed. For example, in a case where multi-shot combination is performed in which the image sensor is relatively moved by one pixel, it is possible to perform pairing of images and perform the comparison operation without division into image regions, pairing of image regions, and the comparison operation.

Third Embodiment

For the digital camera 1 according to the first and second embodiments described above, the case is assumed where driving (for example, driving for image blur correction) of a movable member (for example, the image sensor 11) using the anti-shake unit 80 is not performed in the multi-shot combination mode. However, when images need not be completely fixed to a specific position (position displacement between a plurality of images need not be completely corrected) but only rough image-blur positioning correction needs to be performed, driving for image blur correction using the anti-shake unit 80 can be performed.

That is, even in a case where driving for image blur correction using the anti-shake unit 80 is performed, to be precise, it is not possible to (completely) eliminate an image blur (displacement may occur for an amount of several microns). Therefore, in a third embodiment, such an amount of displacement is positively used to perform multi-shot combination. This configuration is based on the fact that, when the amount of driving for image blur correction using the anti-shake unit 80 is compared with the amount of position displacement (amount of pixel displacement) in each image required in multi-shot combination, the amount of driving for image blur correction is significantly larger than the required amount of position displacement (amount of pixel displacement).

In the third embodiment, a multi-shot combination mode (a mode of multi-shot combination using camera shake in which driving for image blur correction using the anti-shake unit 80 is performed) is set, and thereafter, a plurality of images are obtained through, for example, consecutive image capturing. Then, an image combining process using the plurality of images is performed to obtain one combined image.

For example, the amount of pixel displacement between a plurality of images is detected, any of the plurality of images is set as a reference image while the remaining images are set as comparison images, a combination target image is selected from among the comparison images in accordance with the amount of pixel displacement between the reference image and each of the comparison images, and the reference image and the combination target image are relatively moved in accordance with the amount of position displacement to obtain a combined image.

Alternatively, a plurality of images are each divided into image regions so that the image regions of each of the images correspond to the image regions of the other images, the amount of position displacement for each set of corresponding image regions in the plurality of images is detected, combination target image regions are selected from the plurality of images in accordance with the amount of position displacement, and a combined image is obtained on the basis of the amount of position displacement and the combination target image regions.

The configuration of the anti-shake unit 80 is described in detail with reference to FIGS. 17A and 17B to FIG. 20. In each of the figures, a direction parallel to the optical axis O of the image capturing optical system is assumed to be a first direction (Z direction or Z-axis direction), a direction orthogonal to the first direction is assumed to be a second direction (X direction or X-axis direction), and a direction orthogonal to both the first direction and the second direction is assumed to be a third direction (Y direction or Y-axis direction). For example, when the X axis, the Y axis, and the Z axis are assumed to be the coordinate axes of a 3D rectangular coordinate system, if it is assumed that the optical axis O corresponds to the Z axis, the axes in two directions that are orthogonal to the Z axis and that are orthogonal to each other are the X axis and the Y axis. When the camera is normally positioned (horizontally positioned), the first direction (Z direction, Z axis, or optical axis O) and the second direction (X direction or X axis) are horizontal directions, and the third direction (Y direction or Y axis) is a vertical direction.

The digital camera 1 includes, as detectors for detecting shakes (vibrations) of the camera body CB, a roll (tilt (rotation) about the Z axis) detecting unit, a pitch (tilt (rotation) about the X axis) detecting unit, a yaw (tilt (rotation) about the Y axis) detecting unit, an X-direction acceleration detecting unit, a Y-direction acceleration detecting unit, and a Z-direction acceleration detecting unit. These detectors are formed of, for example, a six-axis sensor or a combination of a three-axis gyro sensor and a three-axis acceleration sensor. The detectors may constitute part of the sensor 70 illustrated in FIG. 1.

An image capturing block (for example, the camera unit 10 illustrated in FIG. 1) includes an image sensor element 110 and a stage device 120 that supports the image sensor element 110. The stage device 120 includes a movable stage 121 on which the image sensor element 110 is mounted, and a front fixing yoke 122 and a rear fixing yoke 123 that are respectively located on the front side and rear side of the movable stage 121. The stage device 120 can raise the movable stage 121 relative to the front fixing yoke 122 and the rear fixing yoke 123 (can raise the movable stage 121 against gravity and keep the movable stage 121 stationary) at least when power is supplied thereto. The stage device 120 can translate the movable stage 121 in a raised state in the Z direction (first direction), in the X direction (second direction) orthogonal to the Z direction, and in the Y direction (third direction) orthogonal to both the Z direction and the X direction and can tilt (rotate) the movable stage 121 in a raised state about the X axis (X direction or second direction), about the Y axis (Y direction or third direction), and about the Z axis (Z direction or first direction), that is, can move the movable stage 121 in a raised state with six degrees of freedom (six-axis movement).

A body CPU (for example, the CPU 90 illustrated in FIG. 1) computes the shake direction, shake speed, etc. of the digital camera 1 on the basis of the pitch (tilt (rotation) about the X axis), the yaw (tilt (rotation) about the Y axis), the roll (tilt (rotation) about the Z axis), the acceleration in the X direction, the acceleration in the Y direction, and the acceleration in the Z direction. The body CPU computes the driving direction, driving speed, driving amount, etc. of the image sensor element 110 so that an object image projected onto the image sensor element 110 does not move relative to the image sensor element 110, and drives the stage device 120 on the basis of the computation results so as to translate, tilt, translate while tilting, translate after tilting, and tilt after translating.

The stage device 120 holds the movable stage 121 to which the image sensor element 110 is fixed such that the movable stage 121 can translate, tilt, translate while tilting, and translate after tilting relative to the front fixing yoke 122 and the rear fixing yoke 123. The movable stage 121 is a board-like rectangular member larger than the image sensor element 110 in front view. The front fixing yoke 122 and the rear fixing yoke 123 are formed of frame-like rectangular members of the same shapes having an outline size larger than that of the movable stage 121 in plan view, and respectively have an opening 122a and an opening 123a of a rectangular shape larger than the outline size of the image sensor element 110 in front view (when viewed in the Z direction) in a center portion thereof.

Figure 17A:
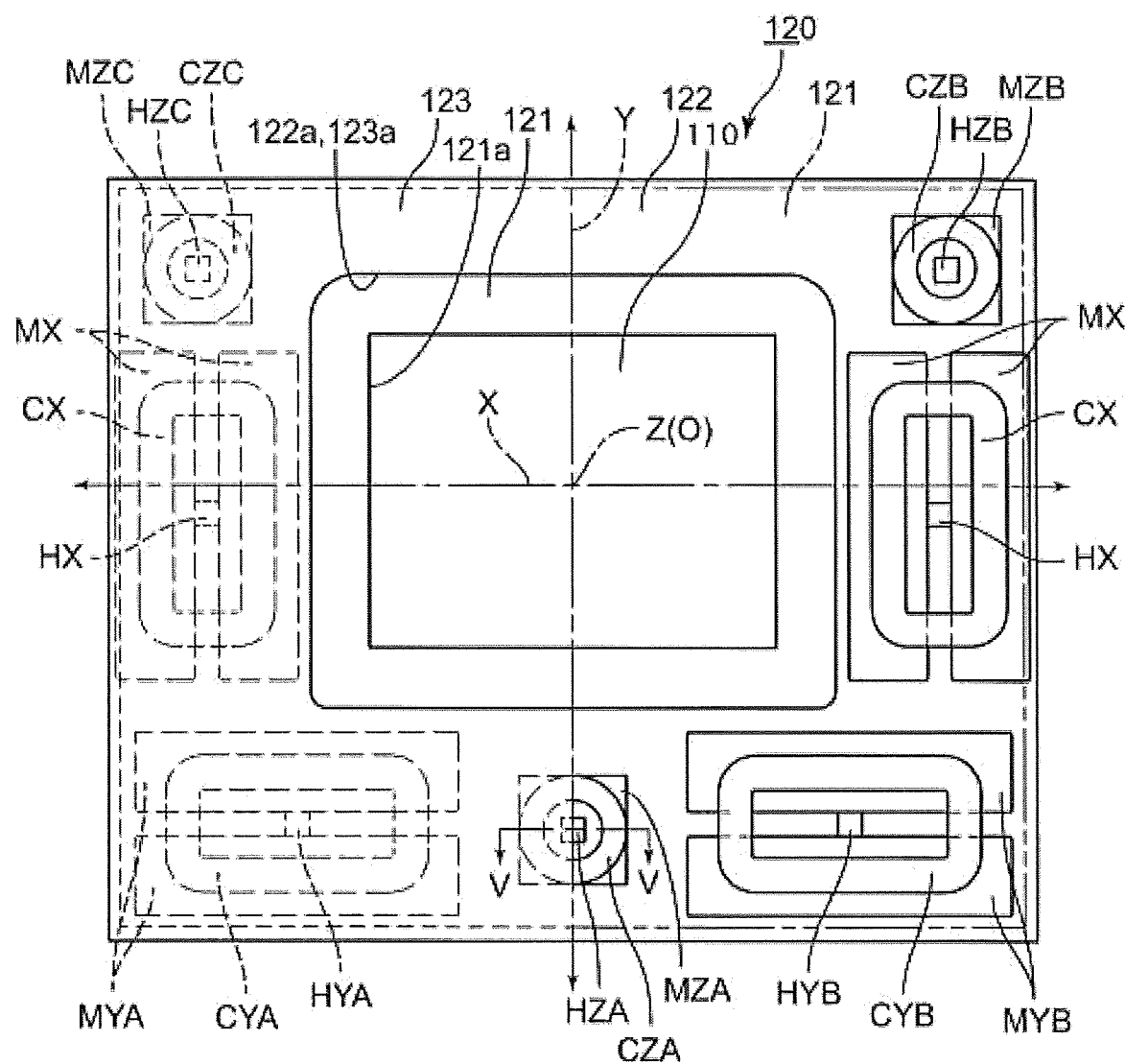
Figure 18:
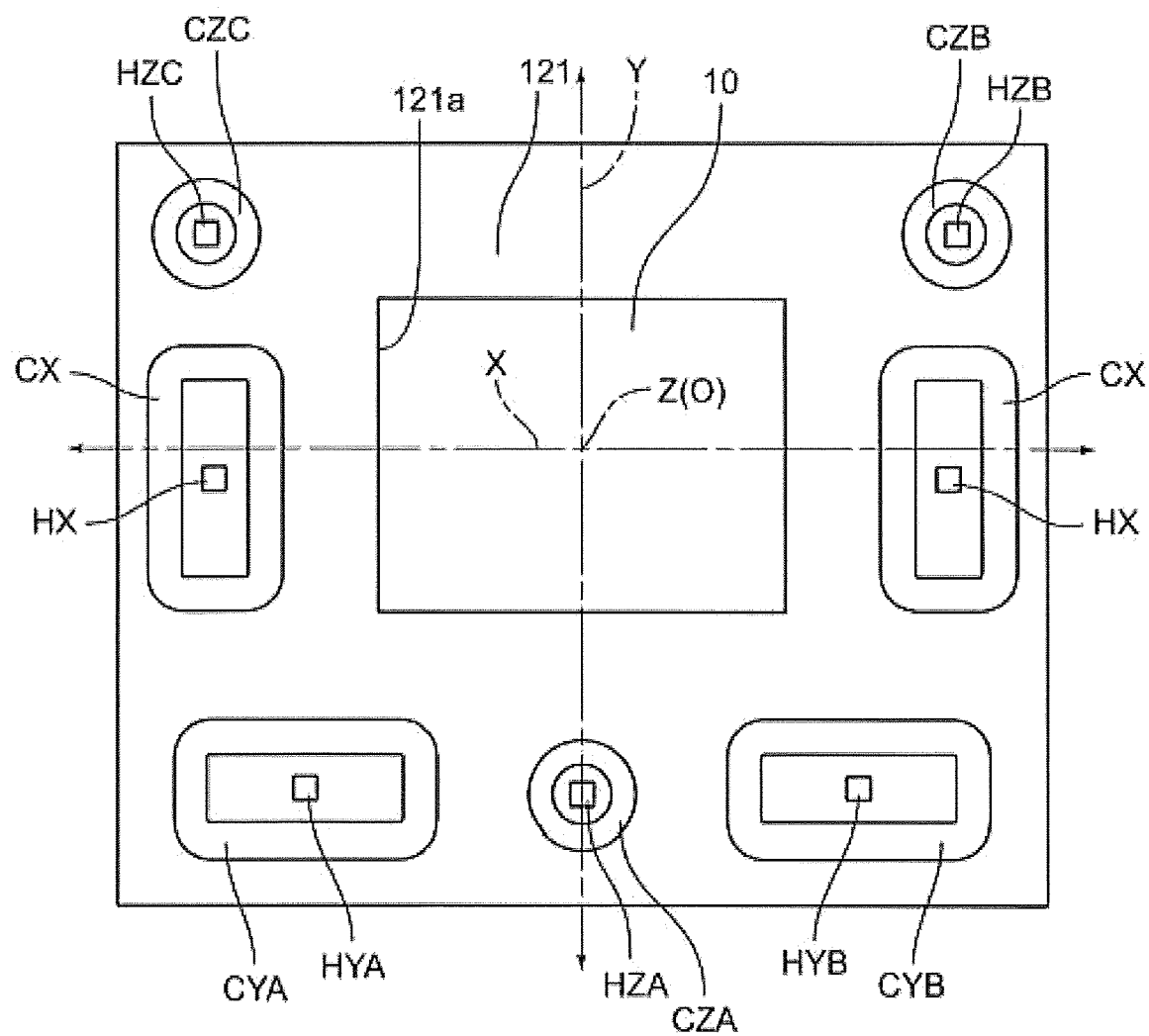
FIG. 18 is a rear view of a movable stage of the anti-shake unit.
Figure 19:
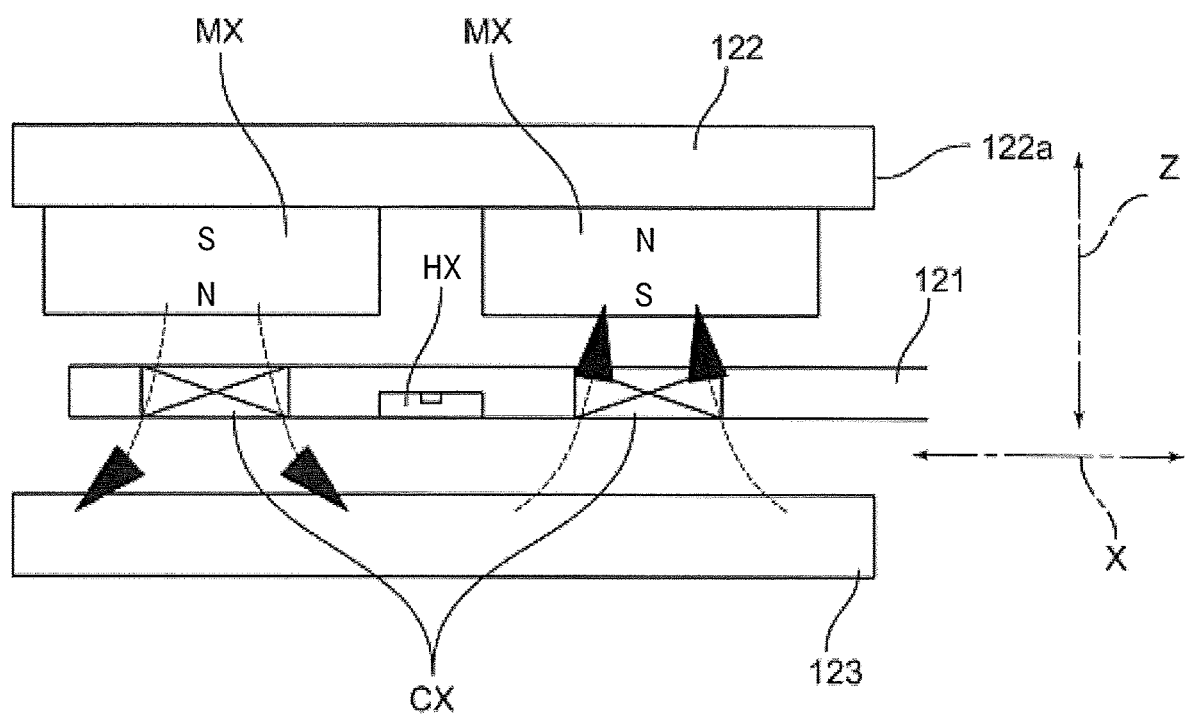
FIG. 19 is a cross-sectional view of an X driving unit including X-direction magnets and an X-driving coil in an enlarged manner.

On the rear surface of the front fixing yoke 122 (on the surface opposite the object side), X-direction magnets MX formed of a pair of right and left permanent magnets of the same specification are fixed to at least the right side or the left side (in the X direction) of the opening 122a or are fixed so as to be located on both the right side and the left side, as illustrated in FIGS. 17A and 17B, with the Y axis, which serves as the center line, and the Z axis therebetween. When the front fixing yoke 122 and the rear fixing yoke 123 allow magnetic flux of the X-direction magnets MX on the right and left sides to pass therethrough, a magnetic circuit that generates thrust in the X direction (second direction) is formed between the X-direction magnets MX on the right and left sides and the facing portions of the rear fixing yoke 123.

On the rear surface of the front fixing yoke 122, Y-direction magnets MYA formed of a pair of permanent magnets of the same specification and Y-direction magnets MYB formed of a pair of permanent magnets of the same specification are fixed below the opening 122a so as to be located apart from the Z axis with the Y axis, which serves as the center line, therebetween. When the front fixing yoke 122 and the rear fixing yoke 123 allow magnetic flux of the Y-direction magnets MYA and the Y-direction magnets MYB to pass therethrough, a magnetic circuit that generates thrust in the Y direction (third direction) is formed between the Y-direction magnets MYA and the Y-direction magnets MYB, and the rear fixing yoke 123.

On the rear surface of the front fixing yoke 122, Z-direction magnets MZA, MZB, and MZC formed of permanent magnets of the same specification are fixed to three positions different from the positions of the X-direction magnets MX and the Y-direction magnets MYA and MYB. The three Z-direction magnets MZA, MZB, and MZC are arranged at substantially equal intervals within a plane orthogonal to the Z axis and centered on the Z axis. When the front fixing yoke 122 and the rear fixing yoke 123 allow magnetic flux of the Z-direction magnets MZA, MZB, and MZC to pass therethrough, a plurality of magnetic circuits that generate thrust in the Z direction (first direction) are formed between the Z-direction magnets MZA, MZB, and MZC, and the rear fixing yoke 123.

In a center portion of the movable stage 121, an image sensor element fitting opening 121a having a square shape in front view is provided, and the image sensor element 110 fits in and is fixed to the image sensor element fitting opening 121a. The image sensor element 110 protrudes forward from the image sensor element fitting opening 121a in the direction of the optical axis O of the movable stage 121.

To the movable stage 121, X-driving coils CX are fixed to positions external to the right and left sides (short sides) of the image sensor element 110 as a pair, and a Y-driving coil CYA and a Y-driving coil CYB are fixed to positions in a portion below the lower side (long side) of the image sensor element 110 as a pair so as to be apart from each other in the right-left direction. To the movable stage 121, a Z-driving coil CZA having a circle shape is further fixed to a position (intermediate position) between the pair of Y-driving coils CYA and CYB, and a Z-driving coil CZB and a Z-driving coil CZC having a circle shape are further fixed, as a pair, to positions above the pair of X-driving coils CX.

The X-driving coils CX, the Y-driving coil CYA and Y-driving coil CYB, and the Z-driving coil CZA, Z-driving coil CZB, and Z-driving coil CZC are connected to an actuator driving circuit (not illustrated) and are supplied with power and controlled via the actuator driving circuit.

To the movable stage 121, an X-direction Hall element HX located in the air-core region of each of the X-driving coils CX, a Y-direction Hall element HYA and a Y-direction Hall element HYB respectively located in the air-core regions of the Y-driving coils CYA and CYB, and a Z-direction Hall element HZA, a Z-direction Hall element HZB, and a Z-direction Hall element HZC respectively located in the air-core regions of the Z-driving coils CZA, CZB, and CZC are fixed.

A position detecting circuit (not illustrated) detects the X-direction position, the Y-direction position, the Z-direction position, the position of the tilt about the X axis (the angle of the tilt (rotation) about the X axis or the pitch angle), the position of the tilt about the Y axis (the angle of the tilt (rotation) about the Y axis or the yaw angle), and the position of the tilt about the Z axis (the angle of the tilt (rotation) about the Z axis or the roll angle) of the movable stage 121 on the basis of detection signals output from the X-direction Hall elements HX, the Y-direction Hall elements HYA and HYB, and the Z-direction Hall elements HZA, HZB, and HZC.

When the actuator driving circuit (not illustrated) supplies power to and controls the X-driving coils CX, the Y-driving coil CYA and Y-driving coil CYB, and the Z-driving coil CZA, Z-driving coil CZB, and Z-driving coil CZC in accordance with the detection results from the position detecting circuit (not illustrated), the image sensor element 110 (movable stage 121) can be driven. For example, the anti-shake unit 80 drives the image sensor element 110, which constitutes at least part of the image capturing unit, as a driven member in a direction different from the optical axis O (Z axis) to thereby function as a camera-shake correction mechanism (driving mechanism) for correcting an image blur. The driven member, which is a driven target, is not limited to the image sensor element 110 and, for example, part of an image capturing lens can be made to function as an image blur correcting lens.

The present inventors have studied a technique in which multi-shot combination is performed while driving for image blur correction using, for example, the six-axis driving unit described above is performed (note that image blur correction may be performed in any form), and have found the following as a result of the study. Even if displacement of the driven member (image sensor element) in a translational direction remains within the plane (X-Y plane) orthogonal to the optical axis O (Z axis), the displacement affects the quality of an image obtained as a result of multi-shot combination to a small degree. However, if displacement of the driven member (image sensor element) in a rotational direction remains within the plane (X-Y plane) orthogonal to the optical axis O (Z axis), the displacement adversely affects the quality of an image obtained as a result of multi-shot combination.

As described above, in the present embodiments, the image operation for, for example, detecting the amount of position displacement (amount of pixel displacement) between a plurality of images or image regions is performed on the basis of the X and Y coordinate axes within the X-Y plane. Therefore, if the amount of displacement in a rotational direction within the X-Y plane is large, it is not possible to correlate the plurality of images or the plurality of image regions, and it may be difficult to appropriately perform the image operation.

Figure 21A:
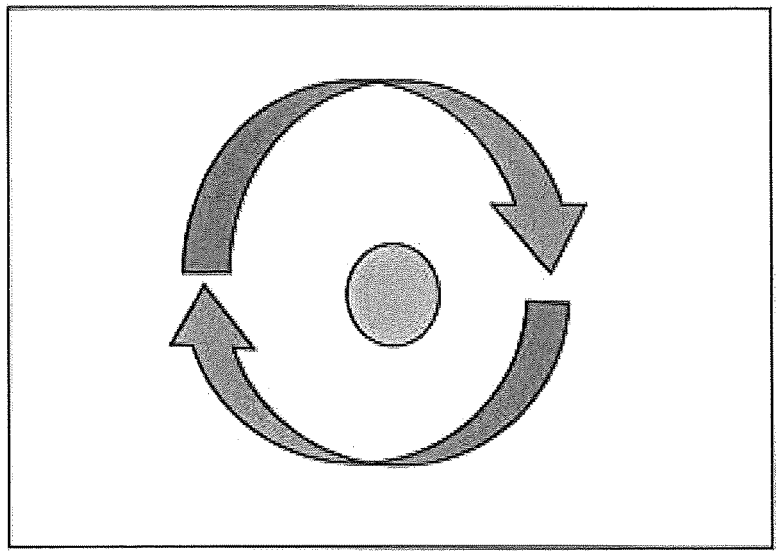
FIGS. 21A and 21B are diagrams illustrating an example adverse effect produced by an image blur in a rotational direction within an X-Y plane.
Figure 21B:
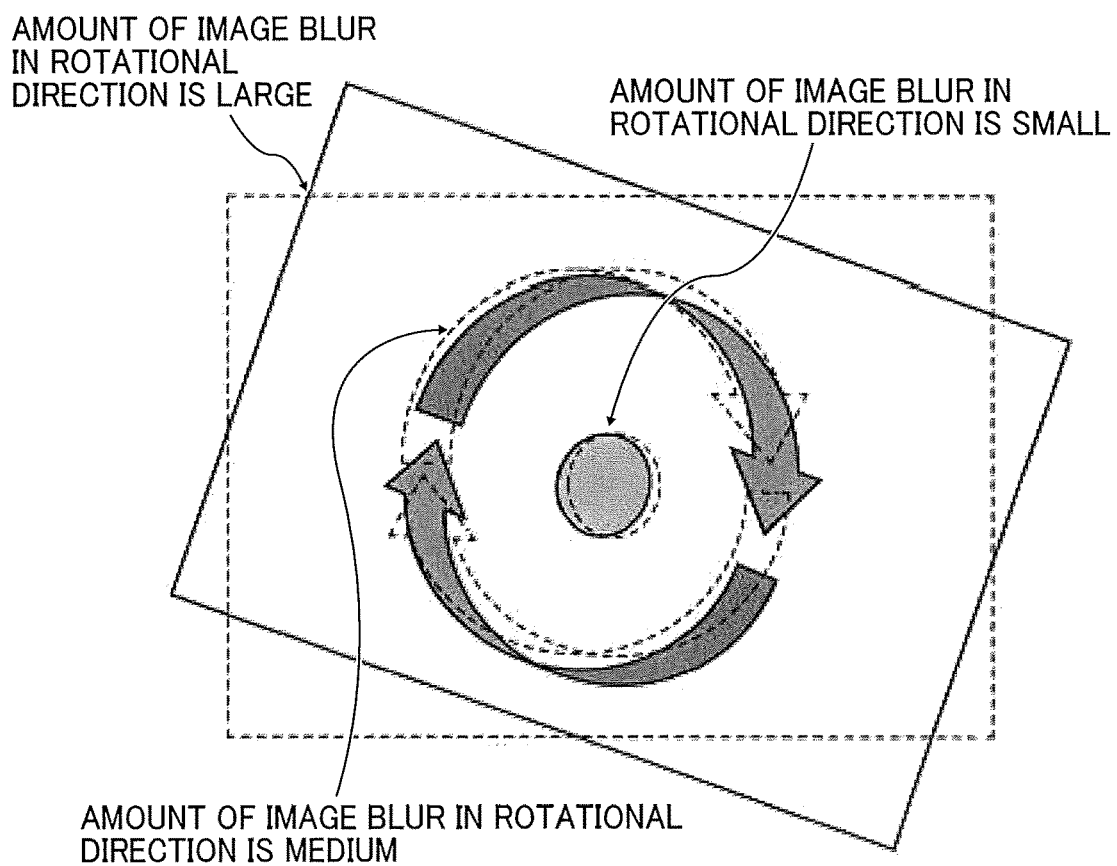

FIGS. 21A and 21B are diagrams illustrating an example adverse effect produced by an image blur in a rotational direction within the X-Y plane. As illustrated in FIG. 21B, the amount of image blur in a rotational direction within the X-Y plane is smaller at a position closer to the optical axis O (Z axis) (closer to a center portion of the image) and larger at a position further from the optical axis O (Z axis) (closer to a peripheral portion of the image).

In the present embodiments, the anti-shake unit 80 is used to correct not only the amount of displacement in a translational direction within the plane (X-Y plane) orthogonal to the optical axis O (Z axis) but also the amount of displacement in a rotational direction within the plane (X-Y plane) orthogonal to the optical axis O (Z axis). As a result, the accuracy of the image operation can be increased, and the quality of an image obtained as a result of multi-shot combination can be increased. Further, the processing load and processing time required for the image operation can be reduced.

The anti-shake unit (driving mechanism) 80 may relatively decrease the driving component (driving amount) of the driven member (image sensor element) in a translational direction within the plane (X-Y plane) orthogonal to the optical axis O (Z axis) and may relatively increase the driving component (driving amount) of the driven member (image sensor element) in a rotational direction within the plane (X-Y plane) orthogonal to the optical axis O (Z axis). Accordingly, the displacement component (amount of displacement) of the driven member (image sensor element) in a translational direction that remains but affects the quality of an image obtained as a result of multi-shot combination to a small degree is allowed to some extent, and the displacement component (amount of displacement) of the driven member (image sensor element) in a rotational direction that aversely affects the quality of an image obtained as a result of multi-shot combination to a large degree is proactively removed, so that the quality of an image obtained as a result of multi-shot combination can be increased.

As in the second embodiment, when the divider 27 is used to divide each of the plurality of images into image regions so that the image regions of each of the images correspond to the image regions of the other images, and to compute the amount of position displacement (amount of pixel displacement) for each set of corresponding image regions, the adverse effect of the amount of displacement of the driven member (image sensor element) in a rotational direction can be reduced.

In this case, it is desirable that the divider 27 divide each of the plurality of images into image regions having different sizes. More specifically, it is desirable that the divider 27 divide a center portion of each of the plurality of images into image regions having a relatively large size and divide a peripheral portion of each of the plurality of images into image regions having a relatively small size.

Figure 22:
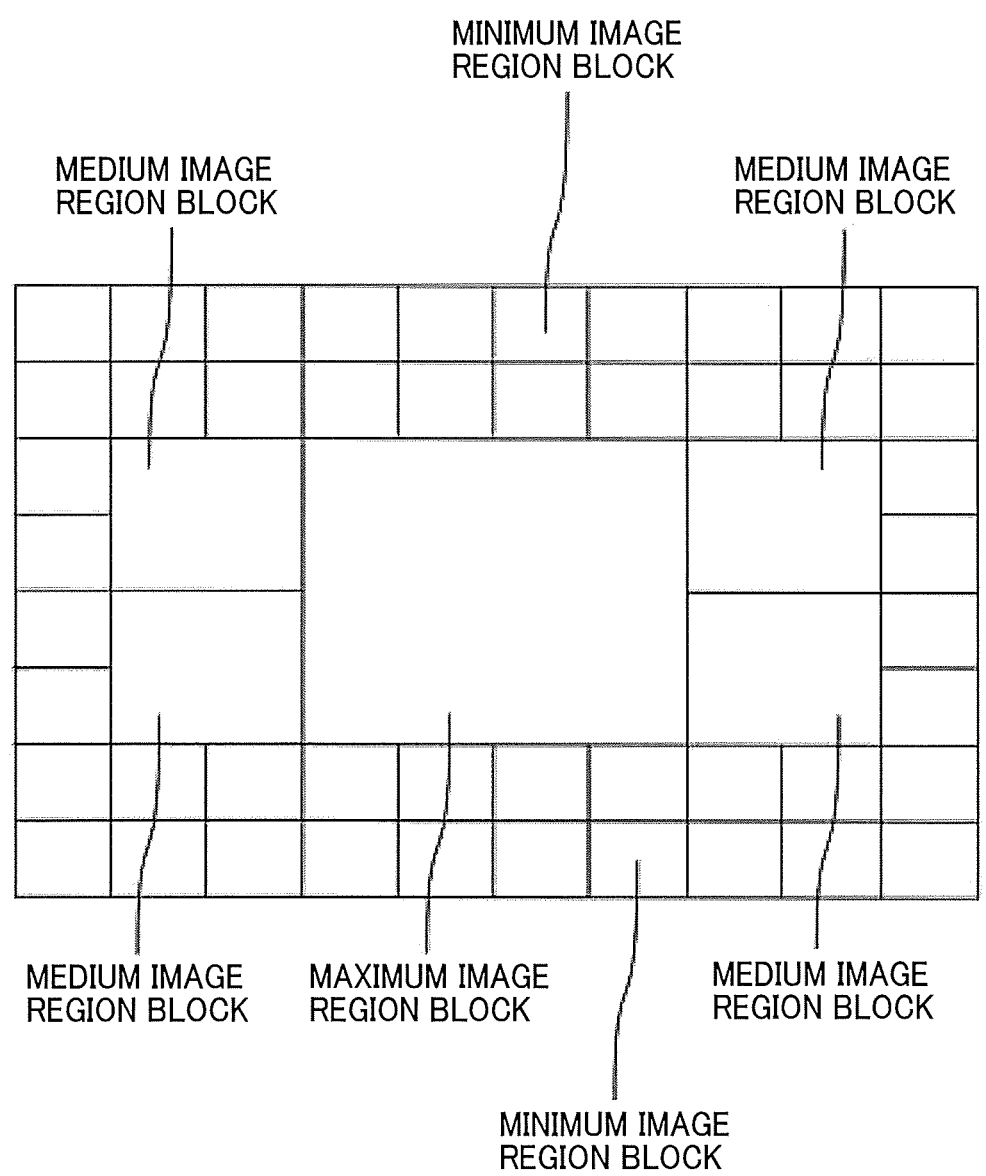
FIG. 22 is a diagram illustrating an example case where a plurality of images are each divided into image regions having different sizes.

FIG. 22 is a diagram illustrating an example case where a plurality of images are each divided into image regions having different sizes. In FIG. 22, an image region that is equivalent to 80 minimum block units formed of eight blocks in length and ten blocks in width is divided into a maximum image region block in a center portion of the image, two medium image region blocks that are located to the right and to the left of the maximum image region block, and minimum image region blocks in a peripheral portion of the image surrounding the maximum image region block and the total of four medium image region blocks. The maximum image region block has a size equivalent to 16 minimum image region blocks (minimum block units) formed of four blocks in both length and width, and each of the medium image region blocks has a size equivalent to four minimum image region blocks (minimum block units) formed of two blocks in both length and width.

For example, in a case where displacement in a rotational direction occurs between a plurality of images, the amount of displacement is smaller at a position closer to a center portion of the image and larger at a position closer to a peripheral portion of the image (see FIG. 21B). Therefore, the image region in a center portion of each image in which the amount of displacement in a rotational direction is small is divided into large blocks while the image region in a peripheral portion of the image in which the amount of displacement in a rotational direction is large is divided into small blocks, so that the image operation can be performed with higher accuracy in each image region block (specifically, the image region blocks in a peripheral portion of the image), and the quality of an image obtained as a result of multi-shot combination can be increased. Further, the processing load and processing time required for the image operation can be reduced. If the entire image region is divided into the minimum image region blocks (minimum block units) in FIG. 22, the processing load and processing time required for the image operation increase. If the entire image region is divided into the maximum image region blocks in FIG. 22, it might not be possible to correlate the image region blocks (it might not be possible to compute the amount of pixel displacement) in a peripheral portion of the image in which the amount of displacement in a rotational direction is large.

The technique disclosed herein is not limited to the above-described embodiments, and various changes, replacements, and modifications can be made without departing from the spirit of the technical idea. Further, if the technical idea can be implemented using another method with the advancement of technology or other derivative technology, such a method may be used to implement the present disclosure. Therefore, the scope of the claims covers any and all embodiments that can be within the scope of the technical idea.

For example, selection as to whether to correct a defective pixel at the time of image capturing may be made in default setting or may be made by a user as a mode of the image capturing device. The correction target image data for which the defective pixel correction process is to be performed may be automatically selected by the image processing device or by a user as desired from among saved images.

A correction processing device for defective pixels may be included in the image processing device 20 or may be provided separately from the image processing device 20. In the latter case, a configuration may be employed in which a plurality of images are input to the correction processing device for defective pixels, and a corrected image is output from the correction processing device.

In the above-described embodiments, the method has been described in which the defective pixel correction process and multi-shot combination are combined, and a plurality of pieces of image data are combined after defective pixel correction to increase the resolution of the image. However, regarding the defective pixel correction, the correction value may be calculated from position information about a defective pixel and the amount of position displacement, and the defective pixel in the correction target image data may be replaced with the correction value without combining the correction image data and the correction target image data.

In the above-described embodiments, the example case where a plurality of pieces of correction image data are present has been illustrated and described; however, the correction value for a defective pixel in the correction target image data can be calculated as long as at least one piece of correction image data is present.

When the correction value for a defective pixel is calculated, gain correction may be performed to correct an exposure difference between the correction target image data and the correction image data or between pieces of correction target image data.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

Any one of the above-described operations may be performed in various other ways, for example, in an order different from the one described above.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA), and conventional circuit components arranged to perform the recited functions.

The invention claimed is:

1. An image capturing device, comprising:
   circuitry configured to
      receive first image data of a reference image and second image data of a combination target image, including obtaining information of a different color of each pixel of each of the reference image and the combination target image;
      determine a second pixel included in the second image data and corresponding to a first pixel included in the first image data;
      correct a value of the first pixel of the reference image based on a value of the second pixel; and
      combine the information of the different color of each pixel of the corrected reference image and the information of the different color of each pixel of the combination target image or information of a different color of each pixel of an image other than the combination target image, to obtain a combined image.

2. The image capturing device according to claim 1, wherein the circuitry is further configured to:
   calculate an amount of position displacement between the first image data and the second image data; and
   obtain at least one of the value of the second pixel in the second image data and a correction value based on the second pixel, based on the amount of position displacement and position information about the first pixel in the first image data.

3. The image capturing device according to claim 2, wherein the circuitry is further configured to:
   match a pixel position in the first image data with a pixel position in the second image data in accordance with the amount of position displacement;
   set a pixel of interest at a position common between the first image data and the second image data;
   obtain, when the pixel of interest in the first image data is the first pixel, at least one of the value of the second pixel in the second image data and the correction value based on the second pixel, based on the pixel of interest in the second image data and the other pixel in the second image data; and
   correct the first pixel with at least one of the value of the second pixel and the correction value.

4. The image capturing device according to claim 3, wherein
   when the pixel of interest in the first image data is the first pixel, the circuitry is further configured to extract the pixel of interest in the second image data as at least one of the value of the second pixel and the correction value.

5. The image capturing device according to claim 3, wherein
   when the pixel of interest in the first image data is the first pixel, the circuitry is further configured to calculate at least one of the value of the second pixel and the correction value based on a group of pixels adjacent to the pixel of interest in the second image data.

6. The image capturing device according to claim 1, wherein the circuitry is further configured to:
   obtain the first image data and the second image data while moving an image sensing surface of an image sensor element relative to a light flux from an object by a pixel unit; and
   control a size of the pixel unit so that, in the first image data and the second image data, a plurality of defective pixels including a reference pixel are not present in a referenced region that is located around the reference pixel.

7. The image capturing device according to claim 6, wherein the circuitry is further configured to:
   perform, when an image surface phase difference correction pixel corresponding to one color of red, green, and blue colors is set in at least one of the first image data and the second image data and where another pixel of the same color is moved to an original position of the image surface phase difference correction pixel, replacement with the other pixel.

8. The image capturing device according to claim 1, wherein the first image data and the second image data are output from the image sensor element.

9. The image capturing device according to claim 1, wherein the first image data and the second image data have different image position relationships.

10. The image capturing device according to claim 1, wherein the circuitry is further configured to combine the first image data and the second image data to obtain combined image data.

11. An image capturing method, comprising:
    receiving first image data of a reference image and second image data of a combination target image, including obtaining information of a different color of each pixel of each of the reference image and the combination target image;
    determining a second pixel included in the second image data and corresponding to a first pixel included in the first image data;

correcting a value of the first pixel of the reference image based on a value of the second pixel; and combining the information of the different color of each pixel of the corrected reference image and the information of the different color of each pixel of the combination target image or information of a different color of each pixel of an image other than the combination target image, to obtain a combined image.

12. A non-transitory recording medium storing a plurality of instructions which, when executed by one or more processors, cause the processors to perform an image capturing method, comprising:

receiving first image data of a reference image and second image data of a combination target image, including obtaining information of a different color of each pixel of each of the reference image and the combination target image;

determining a second pixel included in the second image data and corresponding to a first pixel included in the first image data;

correcting a value of the first pixel of the reference image based on a value of the second pixel; and combining the information of the different color of each pixel of the corrected reference image and the information of the different color of each pixel of the combination target image or information of a different color of each pixel of an image other than the combination target image, to obtain a combined image.

13. An image processing device, comprising:
circuitry configured to
receive first image data of a reference image and second image data of a combination target image, including obtaining information of a different color of each pixel of each of the reference image and the combination target image;
determine a second pixel included in the second image data and corresponding to a first pixel included in the first image data;
correct a value of the first pixel of the reference image based on a value of the second pixel; and
combine the information of the different color of each pixel of the corrected reference image and the information of the different color of each pixel of the combination target image or information of a different color of each pixel of an image other than the combination target image, to obtain a combined image.

14. An image processing device, comprising:
circuitry configured to
detect an amount of position displacement between pieces of image data;
select correction target image data of a correction target image and correction image data of a correction image in accordance with the amount of position displacement, and obtaining information of a different color of each pixel of each of the correction image and the correction target image; and
change a defective pixel in the correction target image data based on the amount of position displacement and the correction image data, wherein
the correction target image data and the correction image data are combined based on the amount of position displacement by combining, after changing the defective pixel, the information of the different color of each pixel of the correction target image and the information of the different color of each pixel of the correction image or information of a different color of each pixel of an image other than the correction image, to obtain a combined image.

15. An image processing device, comprising:
circuitry configured to
detect an amount of position displacement between pieces of image data;
select a reference image and a combination target image from among a plurality of images in accordance with the amount of position displacement and obtain information of a different color of each pixel of each of the reference image and the combination target image,
set the reference image or the combination target image that includes a defective pixel to be correction target image data;
select correction image data from among the plurality of images in accordance with the correction target image data and the amount of position displacement; and
change the defective pixel in the correction target image data based on the amount of position displacement and the correction image data, wherein
the reference image and the combination target image are combined based on the amount of position displacement by combining, after changing the defective pixel, the information of the different color of each pixel of the reference image and the information of the different color of each pixel of the combination target image to obtain a combined image.

16. An image processing method, comprising:
receiving first image data of a reference image and second image data of a combination target image, including obtaining information of a different color of each pixel of each of the reference image and the combination target image;
determining a second pixel included in the second image data and corresponding to a first pixel included in the first image data;
correcting a value of the first pixel of the reference image based on a value of the second pixel; and
combining the information of the different color of each pixel of the corrected reference image and the information of the different color of each pixel of the combination target image or information of a different color of each pixel of an image other than the combination target image, to obtain a combined image.

17. A non-transitory recording medium storing a plurality of instructions which, when executed by one or more processors, cause the processors to perform an image processing method, comprising:
receiving first image data of a reference image and second image data of a combination target image, including obtaining information of a different color of each pixel of each of the reference image and the combination target image;
determining a second pixel included in the second image data and corresponding to a first pixel included in the first image data;
correcting a value of the first pixel of the reference image based on a value of the second pixel; and
combining the information of the different color of each pixel of the corrected reference image and the information of the different color of each pixel of the combination target image or information of a different color of each pixel of an image other than the combination target image, to obtain a combined image.

18. The image capturing device of claim 1, wherein the circuitry is further configured to receive third image data and fourth image data obtained while moving an image sensing surface of an image sensor element relative to light flux from an object by pixel unit, and correct the value of the first pixel based on values of pixels in the second, third, and fourth image data.

19. The image capturing device of claim 6, wherein the pixel unit used to obtain the first and second image data is one pixel.

* * * * *